(12) United States Patent
Inoue et al.

(10) Patent No.: US 12,363,991 B2
(45) Date of Patent: Jul. 15, 2025

(54) SEMICONDUCTOR DEVICE AND IMAGING DEVICE

(71) Applicant: Semiconductor Energy Laboratory Co., Ltd., Kanagawa-ken (JP)

(72) Inventors: Hiroki Inoue, Kanagawa (JP); Seiichi Yoneda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 345 days.

(21) Appl. No.: 17/796,916

(22) PCT Filed: Jan. 26, 2021

(86) PCT No.: PCT/IB2021/050568
§ 371 (c)(1),
(2) Date: Aug. 2, 2022

(87) PCT Pub. No.: WO2021/156700
PCT Pub. Date: Aug. 12, 2021

(65) Prior Publication Data
US 2023/0075180 A1     Mar. 9, 2023

(30) Foreign Application Priority Data
Feb. 7, 2020   (JP) .................. 2020-020014

(51) Int. Cl.
*H10D 84/03*   (2025.01)
*H10D 84/01*   (2025.01)
(Continued)

(52) U.S. Cl.
CPC ................. *H10D 84/038* (2025.01)

(58) Field of Classification Search
CPC .. H10D 84/038; H10D 30/67; H10D 30/6734; H04N 25/70; H04N 25/76;
(Continued)

(56) References Cited

U.S. PATENT DOCUMENTS 7,924,244 B2 * 4/2011 Kimura ............... G09G 3/3283
345/76
8,525,551 B2   9/2013 Kato
(Continued)

FOREIGN PATENT DOCUMENTS

JP   2013-009311 A   1/2013
JP   2013-009313 A   1/2013
(Continued)

OTHER PUBLICATIONS

International Search Report (Application No. PCT/IB2021/050568) Dated Apr. 20, 2021.
(Continued)

*Primary Examiner* — Dao H Nguyen
(74) *Attorney, Agent, or Firm* — Husch Blackwell LLP

(57) ABSTRACT

A semiconductor device that level-shifts a negative voltage and/or a positive voltage is provided. The semiconductor device includes a first transistor, a second transistor, a third transistor, a fourth transistor, a first capacitor, an input terminal, and an output terminal. A first terminal of the first transistor is electrically connected to a first terminal of the second transistor and the output terminal. A second terminal of the second transistor is electrically connected to a first terminal of the third transistor. A first terminal of the fourth transistor is electrically connected to a gate of the second transistor and a first terminal of the first capacitor, and a second terminal of the first capacitor is electrically connected to the input terminal. The first transistor, the second transistor, the third transistor, and the fourth transistor are of the same polarity.

14 Claims, 20 Drawing Sheets

(51) Int. Cl.
*H10D 84/83* (2025.01)
*H10F 39/00* (2025.01)

(58) Field of Classification Search
CPC ...... H10F 39/018; H10F 39/024; H10F 39/12; H10F 39/8063
See application file for complete search history.

(56) References Cited

U.S. PATENT DOCUMENTS

| | | | |
|---|---|---|---|
| 9,576,994 B2 | 2/2017 | Inoue et al. | |
| 10,170,565 B2 | 1/2019 | Yoneda | |
| 10,490,128 B1* | 11/2019 | Qian | G09G 3/3266 |
| 12,080,240 B2* | 9/2024 | Kim | G09G 3/3233 |
| 2012/0293208 A1 | 11/2012 | Kato | |
| 2012/0293242 A1 | 11/2012 | Kato | |
| 2014/0333365 A1 | 11/2014 | Takahashi | |
| 2015/0102303 A1* | 4/2015 | Kim | H10K 59/1213 |
| | | | 257/40 |
| 2015/0263723 A1 | 9/2015 | Takahashi | |
| 2016/0064443 A1 | 3/2016 | Inoue et al. | |
| 2016/0316159 A1 | 10/2016 | Yoneda | |
| 2017/0162115 A1* | 6/2017 | Chen | H10K 59/1213 |
| 2021/0384906 A1 | 12/2021 | Takahashi et al. | |
| 2022/0383818 A1* | 12/2022 | Chen | G09G 3/3233 |

FOREIGN PATENT DOCUMENTS

| | | |
|---|---|---|
| JP | 2016-140054 A | 8/2016 |
| JP | 2016-208515 A | 12/2016 |
| KR | 2012-0130062 A | 11/2012 |
| KR | 2017-0046128 A | 4/2017 |
| KR | 2017-0141685 A | 12/2017 |
| WO | WO 2016/030801 A1 | 3/2016 |
| WO | WO 2016/170442 A1 | 10/2016 |

OTHER PUBLICATIONS

Written Opinion (Application No. PCT/IB2021/050568) Dated Apr. 20, 2021.

* cited by examiner

FIG. 17A
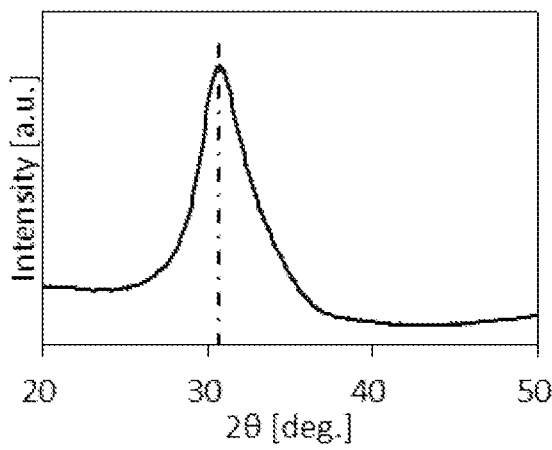
FIG. 17B
FIG. 17C
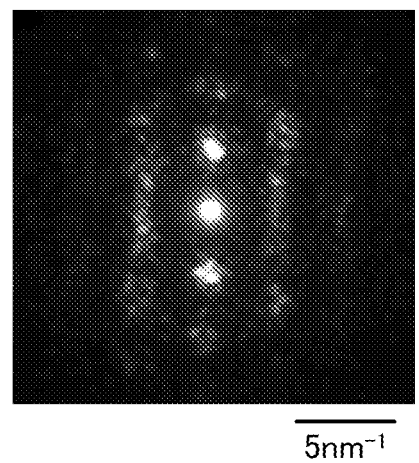

SEMICONDUCTOR DEVICE AND IMAGING DEVICE

This application is a 371 of international application PCT/IB2021/050568 filed on Jan. 26, 2021 which is incorporated herein by reference.

This application is based on Japanese Patent Application Serial No. 2020-020014 filed on Feb. 7, 2020, the entire contents are hereby incorporated herein by reference.

TECHNICAL FIELD

One embodiment of the present invention relates to a semiconductor device and an imaging device.

Note that one embodiment of the present invention is not limited to the above technical field. The technical field of the invention disclosed in this specification and the like relates to an object, an operation method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a sensor, a processor, an electronic device, a system, a driving method thereof, a manufacturing method thereof, and a testing method thereof.

BACKGROUND ART

In recent years, a reduction in power consumption of an electronic device in operation has been highly required. For example, with the aim of reducing power consumption of an electronic device, reducing power consumption of individual logic circuits included in the electronic device has been considered.

Logic circuits can be classified into static logic circuits, dynamic logic circuits, pseudo logic circuits, and the like, for example. A dynamic logic circuit is a circuit that operates by storing data temporarily; thus, leakage current from a transistor causes more severe problems in a dynamic logic circuit than in a static logic circuit. When the amount of leakage current from a transistor is large, the data stored in the dynamic logic circuit is destroyed. An off-state current that flows from a transistor in the off state is one of causes of the leakage current. For example, Patent Document 1 and Patent Document 2 each disclose that leakage current in a dynamic logic circuit is reduced by providing transistors in each of which a channel is formed using an oxide semiconductor.

REFERENCE

Patent Document

[Patent Document 1] Japanese Published Patent Application No. 2013-9311
[Patent Document 2] Japanese Published Patent Application No. 2013-9313

SUMMARY OF THE INVENTION

Problems to be Solved by the Invention

In manufacturing of a semiconductor device, the use of the same material for channel formation regions of a plurality of transistors included in the semiconductor device can shorten the manufacturing process of the semiconductor device in some cases. Specifically, for the material, a metal oxide containing indium, gallium, zinc, or the like can be used, for example.

However, n-type semiconductors of a metal oxide containing indium (e.g., an In oxide) and a metal oxide containing zinc (e.g., a Zn oxide) have been manufactured but p-type semiconductors thereof are difficult to manufacture in terms of mobility and reliability. Therefore, a single-polarity circuit composed of transistors including n-type semiconductors (n-channel transistors) is preferably employed in manufacturing of a semiconductor device. However, the single-polarity circuit does not include a transistor including a p-type semiconductor (a p-channel transistor), and thus is likely to have a large circuit area unlike a CMOS circuit.

Here, a case is considered in which a level shifter that level-shifts an input potential to a lower potential VSSL (referred to as a negative voltage level shifter) is configured as a single-polarity circuit including n-channel transistors. When VSSL is input to a source of an n-channel transistor and an input signal VSS is input to a gate thereof, the gate-source voltage of the n-channel transistor sometimes becomes higher than the threshold voltage, and accordingly the n-channel transistor is not turned off in some cases. When the n-channel transistor is not turned off, the negative voltage level shifter has a circuit configuration in which a stationary current flows; hence, power consumption might be increased.

The level shifter preferably has not only the function of the negative voltage level shifter but also a function of a positive voltage level shifter that level-shifts an input potential to a higher potential. Furthermore, the level shifter preferably has a circuit configuration such that only one of the negative voltage level shifter and the positive voltage level shifter functions depending on the situation.

An object of one embodiment of the present invention is to provide a semiconductor device having a function of shifting an input voltage to a lower voltage or a higher voltage. Another object of one embodiment of the present invention is to provide a semiconductor device with reduced power consumption. Another object of one embodiment of the present invention is to provide a semiconductor device with reduced circuit area.

Another object of one embodiment of the present invention is to provide a novel semiconductor device. Another object of one embodiment of the present invention is to provide an imaging device including the above semiconductor device.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a semiconductor device including a first transistor, a second transistor, a third transistor, a fourth transistor, a first capacitor, an input terminal, and an output terminal. A first terminal of the first transistor is electrically connected to a first terminal of the second transistor and the output terminal. A second terminal of the second transistor is electrically connected to a first terminal of the third transistor. A first terminal of the fourth transistor is electrically connected to a gate of the second transistor and a first terminal of the first capacitor, and a second terminal of the first capacitor is electrically connected to the input terminal. Note that the first transistor, the second transistor, the third transistor, and the fourth transistor may be of the same polarity.

(2)

In one embodiment of the present invention, in the above (1), in the case where a first potential is input to the input terminal, a second potential is input to a second terminal of the first transistor, and a third potential is input to a second terminal of the third transistor and a second terminal of the fourth transistor, the first transistor preferably has a function of precharging the output terminal with the second potential when the first transistor is on, and the second transistor preferably has a function of being turned on or off in response to the first potential input to the input terminal when the fourth transistor is off. The semiconductor device preferably has a function of setting a potential of the output terminal to the second potential or the third potential when the output terminal is precharged with the second potential and the first transistor is turned off, and then the third transistor is turned on.

(3)

Another embodiment of the present invention is a semiconductor device including a first transistor, a second transistor, a third transistor, a fourth transistor, a first capacitor, an input terminal, and an output terminal. A first terminal of the first transistor is electrically connected to a first terminal of the third transistor and the output terminal; a second terminal of the third transistor is electrically connected to a first terminal of the second transistor; a first terminal of the fourth transistor is electrically connected to a gate of the second transistor and a first terminal of the first capacitor; and a second terminal of the first capacitor is electrically connected to the input terminal. A first potential may be input to the input terminal. Note that the first transistor, the second transistor, the third transistor, and the fourth transistor may be of the same polarity.

(4)

In one embodiment of the present invention, in the above (3), in the case where the first potential is input to the input terminal, a second potential is input to a second terminal of the first transistor, and a third potential is input to a second terminal of the second transistor and a second terminal of the fourth transistor, the first transistor preferably has a function of precharging the output terminal with the second potential when the first transistor is on, and the second transistor preferably has a function of being turned on or off in response to the first potential input to the input terminal when the fourth transistor is off. The semiconductor device preferably has a function of setting a potential of the output terminal to the second potential or the third potential when the output terminal is precharged with the second potential and the first transistor is turned off, and then the third transistor is turned on.

(5)

One embodiment of the present invention may be a semiconductor device that has the above-described structure (1) or (4) and includes a second capacitor. A first terminal of the second capacitor is electrically connected to the first terminal of the first transistor, the first terminal of the second transistor, and the output terminal.

(6)

In one embodiment of the present invention, in any one of the above-described structures (1) to (5), each of the first transistor to the fourth transistor may include a metal oxide or silicon in a channel formation region.

(7)

In one embodiment of the present invention, in any one of the above-described structures (1) to (6), the first capacitor may include a fifth transistor. The fifth transistor includes a metal oxide or silicon in a channel formation region. A gate of the fifth transistor serves as one of the first terminal and the second terminal of the first capacitor, and a first terminal and a second terminal of the fifth transistor serve as the other of the first terminal and the second terminal of the first capacitor.

(8)

One embodiment of the present invention is an imaging device including the semiconductor device according to any one of the above (1) to (7) and a photoelectric conversion element. The photoelectric conversion element is preferably positioned above the first transistor to the fourth transistor.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means devices that can function by utilizing semiconductor characteristics. For example, an integrated circuit, a chip including an integrated circuit, and an electronic component including a chip in a package or the like are examples of the semiconductor device. Moreover, a memory device, a display device, a light-emitting device, a lighting device, an electronic device, and the like themselves are semiconductor devices, or include semiconductor devices in some cases.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display device, a light-emitting device, or a load) can be connected between X and Y. Note that a switch has a function of being controlled to be turned on or off. That is, the switch has a function of being in a conducting state (on state) or a non-conducting state (off state) to control whether a current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description, X and Y are electrically connected, includes the case where X and Y are electrically connected (i.e., the case where X and Y are connected through another element or another circuit) and the case where X and Y are directly connected (i.e., the case where X and Y are connected without through another element or another circuit).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components, the function of a wiring and the function of an electrode. Thus, electrical connection in this specification includes, in its category, such a case where one conductive film has functions of a plurality of components.

In this specification and the like, a "resistor" can be, for example, a circuit element or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor" can be replaced with the terms "resistance", "load", "region having a resistance value", and the like; inversely, the terms "resistance", "load", and "region having a resistance value" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1\times10^9$Ω.

In this specification and the like, a "capacitor" can be, for example, a circuit element having an electrostatic capacitance value higher than 0 F, a region of a wiring having an electrostatic capacitance value, parasitic capacitance, or gate capacitance of a transistor. Therefore, in this specification and the like, a "capacitor" sometimes includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; inversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. As another example, the electrostatic capacitance value may be greater than or equal to 1 pF and less than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, are changed with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles is caused" can be rephrased as "electrical conduction of negatively charged particles is caused in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of current in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of a current (or the direction of a current) is not specified in this specification and the like, the description "a current flows from element A to element B" can be rephrased as "a current flows from element B to element A", for example. As another example, the description "current is input to element A" can be rephrased as "current is output from element A".

Ordinal numbers such as "first", "second", and "third" in this specification and the like are used in order to avoid confusion among components. Thus, the terms do not limit the number of components. Furthermore, the terms do not limit the order of components. For example, a "first" component in one embodiment in this specification and the like can be referred to as a "second" component in other embodiments or the scope of claims. As another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction from which each component is described. Thus, the positional relation is not limited to that described with a term in this specification and the like and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" and "under" do not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms such as "film" and "layer" can be interchanged with each other depending on the situation. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "electrode," "wiring," and "terminal" do not functionally limit those components. For example, an "electrode" is used as part of a wiring in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or according to circumstances. Conversely, the term "signal" or the like can be changed into the term "potential" in some cases.

In this specification and the like, an impurity in a semiconductor refers to, for example, elements other than the main components of a semiconductor layer. For instance, an element with a concentration of lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of impurities that change the characteristics of the semiconductor include Group 1 elements, Group 2 elements, Group 13 elements, Group 14 elements, Group 15 elements, and transition metals other than the main components; specific examples are hydrogen (included also in water), lithium, sodium, silicon, boron, phosphorus, carbon, and nitrogen. Specifically, when the semiconductor is a silicon layer, examples of impurities that change the characteristics of the semiconductor include Group 1 elements except hydrogen, Group 2 elements, Group 13 elements, Group 15 elements, and oxygen.

In this specification and the like, a switch has a function of being in a conducting state (on state) or a non-conducting state (off state) to determine whether a current flows or not. Alternatively, a switch has a function of selecting and changing a current path. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conducting state" of the transistor refers to a state where a source electrode and a drain electrode of the transistor can be regarded as being electrically short-circuited. Furthermore, a "non-conducting state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. Moreover, "approximately parallel" or "substantially parallel" indicates a state where two straight lines are placed at an angle greater than or equal to −30° and less than or equal to 30°. In addition, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

One embodiment of the present invention can provide a semiconductor device having a function of shifting an input voltage to a lower voltage or a higher voltage. Another embodiment of the present invention can provide a semiconductor device with reduced power consumption. Another embodiment of the present invention can provide a semiconductor device with reduced circuit area.

Another embodiment of the present invention can provide a novel semiconductor device. Another embodiment of the present invention can provide an imaging device including the above semiconductor device.

Note that the effects of one embodiment of the present invention are not limited to the effects listed above. The effects listed above do not preclude the existence of other effects. The other effects are effects that are not described in this section and will be described below. The effects that are not described in this section are derived from the description of the specification, the drawings, or the like and can be extracted as appropriate from the description by those skilled in the art. Note that one embodiment of the present invention has at least one of the effects listed above and the other effects. Accordingly, one embodiment of the present invention does not have the effects listed above in some cases.

BRIEF DESCRIPTION OF THE DRAWINGS

FIG. 17A is a diagram showing classification of crystal structures of IGZO, FIG. 17B is a diagram showing an XRD spectrum of crystalline IGZO, and FIG. 17C is a diagram showing a nanobeam electron diffraction pattern of crystalline IGZO.

MODE FOR CARRYING OUT THE INVENTION

Figure 1:
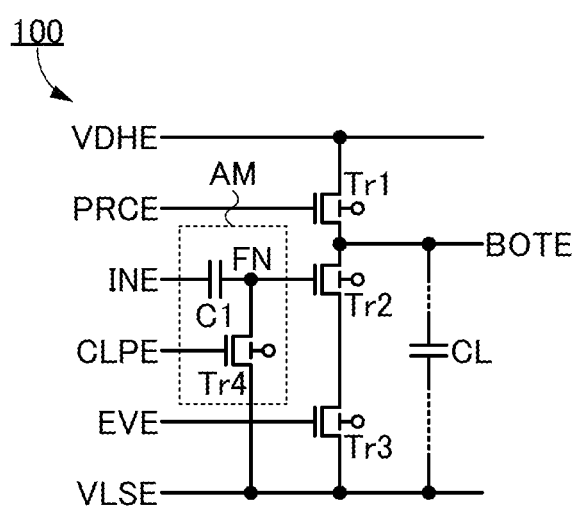
FIG. 1 is a circuit diagram illustrating a configuration example of a semiconductor device.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS FET or an OS transistor is mentioned, it can also be referred to as a transistor including a metal oxide or an oxide semiconductor.

In this specification and the like, a metal oxide containing nitrogen is also referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment (or the example), a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification will be described with reference to the drawings. Note that the embodiments can be implemented in many different modes, and it will be readily appreciated by those skilled in the art that modes and details can be changed in various ways without departing from the spirit and scope thereof. Therefore, the present invention should not be construed as being limited to the description of the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1", "[n]", or "[m,n]" is sometimes added to the reference numerals.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a level shifter that is a semiconductor device of one embodiment of the present invention will be described.

A level shifter in this specification and the like refers to a potential level converter circuit that converts an input voltage level into another voltage level. Here, another voltage may be lower than or higher than the input voltage. Note that depending on the input voltage, the level shifter may output the same voltage as the input voltage without performing level-shifting. For example, the level shifter in this specification and the like may have a function of level-shifting an input high-level potential to a first potential and level-shifting an input low-level potential to a second potential. Note that the first potential may be a potential higher than the high-level potential, the high-level potential, or a potential lower than the high-level potential; the second potential may be a potential higher than the low-level potential, the low-level potential, or a potential lower than the low-level potential. Therefore, for example, the level shifter in this specification and the like may have a function of level-shifting one of an input high-level potential and an input low-level potential to a potential higher than the high-level potential and level-shifting the other of the input high-level potential and the input low-level potential to a potential lower than the low-level potential.

The level shifter, which is the semiconductor device of one embodiment of the present invention, is a circuit using an architecture of a dynamic logic circuit. The dynamic logic circuit is, for example, a circuit driven by operations including temporal data retention, potential precharging, and evaluation.

FIG. 1 illustrates a configuration example of the level shifter. A level shifter 100 includes a transistor Tr1, a transistor Tr2, a transistor Tr3, a transistor Tr4, a capacitor C1, and a capacitor CL.

The transistor Tr1 to the transistor Tr4 are preferably OS transistors, for example. In addition, it is further preferable that a channel formation region in the transistor Tr1 to the transistor Tr4 be an oxide containing at least one of indium, gallium, and zinc. Instead of the oxide, the channel formation region may be an oxide containing at least one of indium, an element M (as the element M, for example, one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like can be given), and zinc. It is further preferable that the transistor Tr1 to the transistor Tr4 have a structure of the transistor particularly described in Embodiment 2.

Alternatively, the transistor Tr1 to the transistor Tr4 may be, for example, transistors including silicon in a channel formation region (referred to as Si transistors in this specification). As silicon, amorphous silicon (sometimes referred to as hydrogenated amorphous silicon), microcrystalline silicon, polycrystalline silicon, single crystal silicon, or the like can be used, for example.

Alternatively, other than OS transistors and Si transistors, transistors including Ge or the like in a channel formation region, transistors including a compound semiconductor such as ZnSe, CdS, GaAs, InP, GaN, or SiGe in a channel formation region, transistors including a carbon nanotube in a channel formation region, transistors including an organic semiconductor in a channel formation region, or the like can be used as the transistor Tr1 to the transistor Tr4, for example.

When the transistor Tr1 to the transistor Tr4 employ similar structures and materials (e.g., materials such as a semiconductor included in a channel formation region, an insulator, and a conductor), the transistor Tr1 to the transistor Tr4 can be formed in the same process; thus, the manufacturing process of the level shifter 100 can be shortened. Note that the semiconductor device of one embodiment of the present invention is not limited thereto, and for example, some of the transistor Tr1 to the transistor Tr4 may be a transistor employing a different structure and material. For example, the transistor Tr1, the transistor Tr3, and the transistor Tr4 may be OS transistors and the transistor Tr2 may be a Si transistor.

FIG. 1 shows back gates of the transistor Tr1 to the transistor Tr4 but does not show the connection configuration of the back gates; a target to which each of the back gates is electrically connected can be determined at the design stage. For example, in a transistor including a back gate, a gate and the back gate may be electrically connected to each other to increase the on-state current of the transistor. That is, for example, the gate and back gate of the transistor Tr1 may be electrically connected to each other, the gate and back gate of the transistor Tr2 may be electrically connected to each other, the gate and back gate of the transistor Tr3 may be electrically connected to each other, and the gate and back gate of the transistor Tr4 may be electrically connected to each other. Alternatively, for example, in a transistor including a back gate, a wiring for electrically connecting the back gate of the transistor to an external circuit or the like may be provided and a potential may be supplied to the back gate of the transistor by the external circuit or the like to change the threshold voltage of the transistor or to reduce the off-state current of the transistor.

Note that the threshold voltages of the transistor Tr1 to the transistor Tr4 are denoted as $V_{TH1}$, $V_{TH2}$, $V_{TH3}$, and $V_{TH4}$. In this specification and the like, unless otherwise specified, each of $V_{TH1}$ to $V_{TH4}$ is a real number larger than 0.

The transistor Tr1 to the transistor Tr4 illustrated in FIG. 1 have back gates; however, the semiconductor device of one embodiment of the present invention is not limited thereto. For example, the transistor Tr1 to the transistor Tr4 illustrated in FIG. 1 may each be a transistor having a structure not including a back gate, i.e., a single-gate structure. It is also possible that some transistors have a structure including a back gate and the other transistors have a structure not including a back gate.

The transistor Tr1 to the transistor Tr4 illustrated in FIG. 1 are n-channel transistors; however, the semiconductor device of one embodiment of the present invention is not limited thereto. For example, some or all of the transistors Tr1 to the transistor Tr4 may be replaced with p-channel transistors.

The above-described examples of changes in the structure and polarity of the transistors are not limited to the transistor Tr1 to the transistor Tr4. For example, the structure and polarity of transistors described in other portions of the specification, transistors shown in other drawings, and the like may be changed in a manner similar to the above.

Unless otherwise specified, the transistor Tr1 to the transistor Tr4 may operate in a saturation region when being in the on state. In other words, when the transistor Tr1 to the transistor Tr4 are on, the gate voltage, source voltage, and drain voltage of each of the transistor Tr1 to the transistor Tr4 are sometimes biased appropriately to voltages in the range where the transistor operates in a saturation region.

A first terminal of the transistor Tr1 is electrically connected to a wiring VDHE, a second terminal of the transistor Tr1 is electrically connected to a first terminal of the transistor Tr2 and a wiring BOTE, and the gate of the transistor Tr1 is electrically connected to a wiring PRCE. A second terminal of the transistor Tr2 is electrically connected to a first terminal of the transistor Tr3, and the gate of the transistor Tr2 is electrically connected to a first terminal of the transistor Tr4 and a first terminal of the capacitor C1. A second terminal of the transistor Tr3 is electrically connected to a wiring VLSE, and the gate of the transistor Tr3 is electrically connected to a wiring EVE. A second terminal of the transistor Tr4 is electrically connected to the wiring VLSE, and the gate of the transistor Tr4 is electrically connected to a wiring CLPE. A second terminal of the capacitor C1 is electrically connected to a wiring INE. A first terminal of the capacitor CL is electrically connected to the wiring BOTE, and a second terminal of the capacitor CL is electrically connected to the wiring VLSE.

The level shifter 100 includes a memory portion AM, for example. The memory portion AM includes the transistor Tr4 and the capacitor C1, for example. In this specification and the like, a point where the gate of the transistor Tr2, the first terminal of the capacitor C1, and the first terminal of the transistor Tr4 are electrically connected to each other is referred to as a node FN.

The memory portion AM has a function of holding a potential at the node FN. Specifically, for example, in the memory portion AM, when the transistor Tr4 is turned on by input of a high-level potential to the wiring CLPE, electrical continuity is established between the node FN and the wiring VLSE, and the potential of the node FN becomes a potential supplied from the wiring VLSE. Here, when the transistor Tr4 is turned off by input of a low-level potential to the wiring CLPE, the memory portion AM can hold the potential, which is supplied from the wiring VLSE, at the node FN.

The capacitor CL is provided to stabilize an output signal from the wiring BOTE. Specifically, for example, when a voltage is output to the wiring BOTE and the transistor Tr1 and the transistor Tr2 are off, the voltage can be held by the capacitor CL. On the other hand, in the case where the capacitor CL is not provided, the voltage of the wiring BOTE may be changed by a leakage current from the transistor Tr1, the transistor Tr2, or the like. Therefore, the level shifter 100 is preferably provided with the capacitor CL. Note that in the case where an undesirable change of the output signal from the wiring BOTE is not caused by parasitic capacitance or the like, the capacitor CL is not necessarily provided in the level shifter 100.

The wiring VDHE functions as a wiring that supplies a constant voltage, for example. Note that the constant voltage is a high-level-side power supply voltage in the level shifter 100. The high-level-side power supply voltage is referred to as VDDH in this specification and the like.

The wiring VLSE functions as a wiring that supplies a constant voltage, for example. Note that the constant voltage is a low-level-side power supply voltage in the level shifter 100. The low-level-side power supply voltage is referred to as VSSL in this specification and the like. VSSL is a voltage lower than VDDH.

The wiring INE is electrically connected to an input terminal of the level shifter 100, for example, and the wiring INE functions as a wiring for supplying an input voltage to the input terminal. For example, the input voltage can be a voltage output from a logic circuit or the like that is electrically connected to the level shifter 100 through the wiring INE. Note that the input voltage (the output voltage of the logic circuit) can be a high-level potential or a low-level potential, for example. In this specification, the high-level potential is referred to as VDD, and the low-level potential is referred to as VSS. VDD is a voltage higher than VSS and lower than VDDH. VSS is a voltage higher than VSSL.

In the case where VDD input to the wiring INE is not level-shifted to VDDH in the level shifter 100, the constant voltage supplied from the wiring VDHE is set to VDDH=VDD. Alternatively, in the case where VSS input to the wiring INE is not level-shifted to VSSL in the level shifter 100, the constant voltage supplied from the wiring VLSE is set to VSSL=VSS.

The wiring PRCE functions as a wiring for controlling whether there is potential charging from the wiring VDHE to the wiring BOTE, for example. Specifically, for example, the wiring PRCE can be a wiring that supplies VDDH+$V_{TH1}$ or VSS. Note that $V_{TH1}$ is the threshold voltage of the transistor Tr1. The high-level potential supplied from the wiring PRCE may be VDDH instead of VDDH+$V_{TH1}$ or may be a potential exceeding VDDH+$V_{TH1}$.

The wiring EVE functions as a wiring that supplies an evaluation signal, for example. Specifically, for example, the wiring EVE can be a wiring that supplies VDDH+$V_{TH3}$ or VSS. Note that $V_{TH3}$ is the threshold voltage of the transistor Tr3. The high-level potential supplied from the wiring EVE may be VDDH instead of VDDH+$V_{TH3}$ or may be a potential exceeding VDDH+$V_{TH3}$. The high-level potential supplied from the wiring EVE may be a potential higher than $V_{TH3}$ and lower than or equal to VDDH.

The wiring CLPE functions as a wiring for controlling switching of the on state and the off state of the transistor Tr4, for example. Specifically, for example, the wiring CLPE can be a wiring that supplies VDD or VSSL. The high-level potential supplied from the wiring CLPE may be VDD+$V_{TH4}$ instead of VDD or may be a potential exceeding VDD+$V_{TH4}$. Note that $V_{TH4}$ is the threshold voltage of the transistor Tr4.

The wiring BOTE is electrically connected to the input terminal of the level shifter 100, for example, and the wiring BOTE functions as a wiring that outputs an output voltage of the level shifter 100. Although described later in detail, when VDD is input to the wiring INE, the level shifter 100 level-shifts VDD to VDDH and also inverts the logic and outputs VSSL to the wiring BOTE. Alternatively, when VSS is input to the wiring INE, the level shifter 100 level-shifts VSS to VSSL and also inverts the logic and outputs VDDH to the wiring BOTE.

Operation Example

Next, an operation example of the level shifter 100 illustrated in FIG. 1 will be described.

Figure 2:
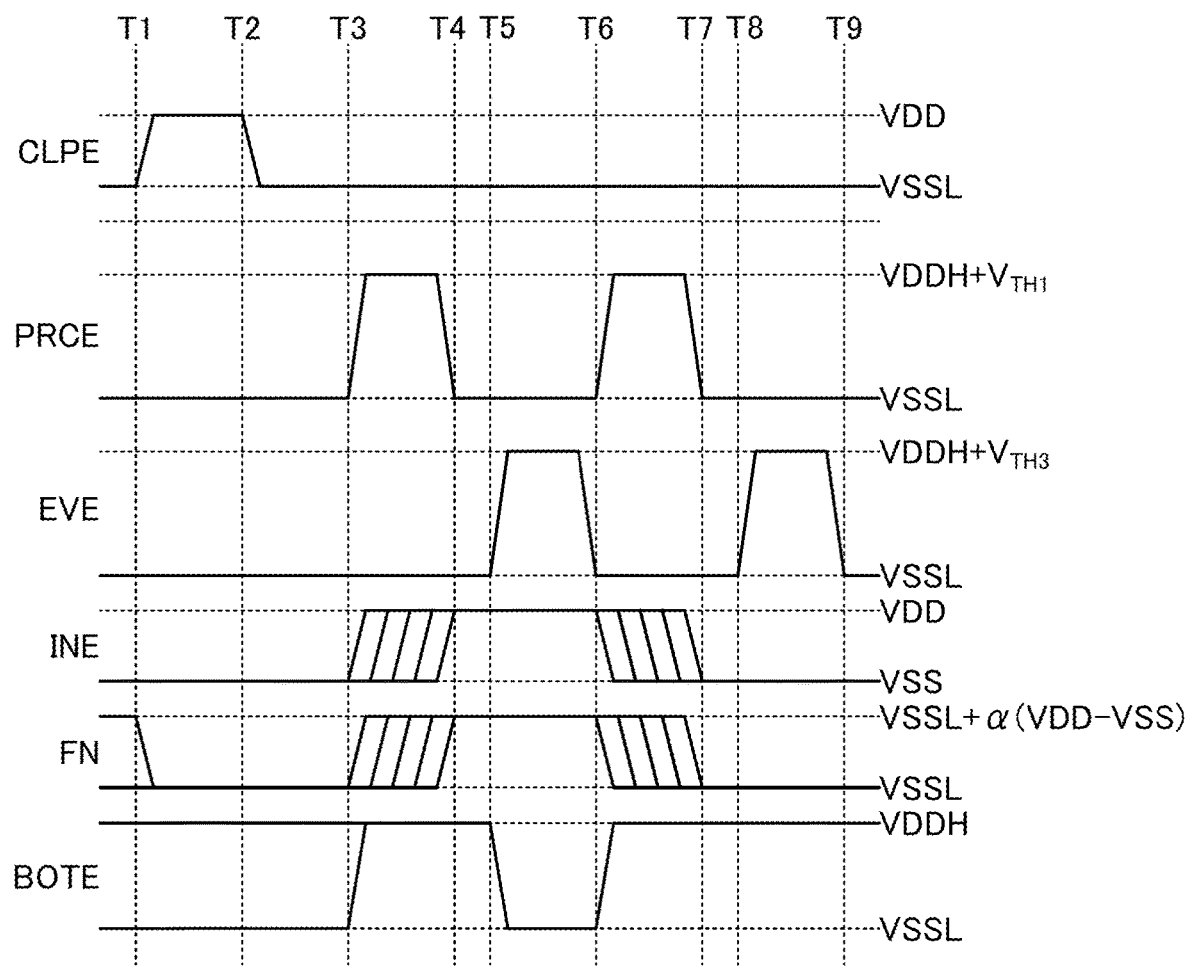
FIG. 2 is a timing chart showing an operation example of a semiconductor device.

FIG. 2 is a timing chart showing changes in the voltages of the wiring CLPE, the wiring PRCE, the wiring EVE, the wiring INE, the node FN, and the wiring BOTE from Time T1 to Time T9 and around that period.

Before Time T1, it is assumed that VSS is input to the wiring INE, VSSL is input to the wiring CLPE, VSSL is input to the wiring PRCE, and VSSL is input to the wiring EVE. It is also assumed that VSSL or VSS is retained at the node FN in the memory portion AM, and VDDH or VSSL is output to the wiring BOTE.

[Period of Writing Potential to Memory Portion AM]

Between Time T1 and Time T3, VSSL is written to the node FN in the memory portion AM. Specifically, between Time T1 and Time T2, VDD as the high-level potential is input to the wiring CLPE. Thus, VDD is input to the gate of the transistor Tr4, whereby the gate-source voltage of the transistor Tr4 becomes VDD−VSSL. Here, by determining $V_{TH4}$ to satisfy VDD−VSSL>$V_{TH4}$, the transistor Tr4 can be turned on.

When the transistor Tr4 is turned on, electrical continuity is established between the wiring VLSE and the node FN. Thus, the potential of the node FN in the memory portion AM becomes VSSL.

Between Time T2 and Time T3, VSSL as the low-level potential is input to the wiring CLPE. Thus, VSSL is input to the gate of the transistor Tr4, so that the gate-source voltage of the transistor Tr4 becomes 0. Since 0<$V_{TH4}$ at this time, the transistor Tr4 is turned off.

When the transistor Tr4 is turned off, electrical continuity between the wiring VLSE and the node FN is broken. Hence, VSSL is retained at the node FN in the memory portion AM. Specifically, at this time, the capacitor C1 retains VSS−VSSL between the first terminal and the second terminal of the capacitor C1.

Since VSSL is input to the gate of the transistor Tr3, the gate-source voltage of the transistor Tr3 becomes 0. Since 0<$V_{TH3}$ at this time, the transistor Tr3 is turned off. Since the transistor Tr3 is off, a current does not flow between the source and the drain of the transistor Tr2.

[Precharge Period (1) and Data Input Period (1)]

Between Time T3 and Time T4, the wiring BOTE is precharged with a potential. Specifically, between Time T3 and Time T4, VDDH+$V_{TH4}$ as the high-level potential is input to the wiring PRCE. Thus, VDDH+$V_{TH1}$ is input to the gate of the transistor Tr1. Since VDDH is input to the first terminal of the transistor Tr1 at this time, charging is performed until the potential of the second terminal of the transistor Tr1 reaches VDDH. When the second terminal of the transistor Tr1 reaches VDDH, the gate-source voltage of the transistor Tr1 becomes 0, and the transistor Tr1 is turned off because 0<$V_{TH1}$. Consequently, the potential of the wiring BOTE becomes VDDH.

After the wiring BOTE is precharged with the potential, VSSL as the low-level potential is input to the wiring PRCE.

Between Time T3 and Time T4, data is input to the level shifter 100. Specifically, between Time T3 and Time T4, VDD as the high-level potential is input to the wiring INE.

When VDD is input to the wiring INE, the potential of the node FN is changed by capacitive coupling of the capacitor C1. At this time, the potential of the node FN becomes VSSL+α(VDD−VSS) because of capacitive coupling of the capacitor C1, for example. Note that a is a capacitance coupling coefficient determined by a circuit configuration around the node FN or the like.

Note that the timing of inputting data to the level shifter 100 is preferably between Time T3 and Time T4, further preferably in a period during which VDDH is input to the wiring PRCE. In other words, VDD is preferably input to the wiring INE while the wiring BOTE is precharged with VDDH.

[Non-Overlap Period (1)]

A period between Time T4 and Time T5 is a non-overlap period. The non-overlap period is provided so that the above-described precharge period between Time T3 and Time T4 and an after-mentioned evaluation period between Time T5 and Time T6 do not overlap each other. Note that the non-overlap period does not need to be provided when the precharge period and the evaluation period do not overlap each other.

[Evaluation Period (1)]

Between Time T5 and Time T6, a signal input to the wiring INE is evaluated. Specifically, between Time T5 and Time T6, VDDH+$V_{TH3}$ as the high-level potential is input to the wiring EVE, for example. Thus, VDDH+$V_{TH3}$ is input to the gate of the transistor Tr3. When VDDH+$V_{TH3}$ is input to the gate of the transistor Tr3, the gate-source voltage of the transistor Tr3 becomes VDDH+$V_{TH3}$−VSSL. Since VDDH+$V_{TH3}$−VSSL>$V_{TH3}$, that is, VDDH−VSSL>0 is satisfied here, the transistor Tr3 can be turned on. Accordingly, electrical continuity is established between the second terminal of the transistor Tr2 and the wiring VLSE, and the potential VSSL supplied from the wiring VLSE is input to the second terminal of the transistor Tr2. As another example, as the high-level potential, $V_{EVE}$ that is a potential higher than $V_{TH3}$ and lower than or equal to VDDH may be input to the wiring EVE. In that case, the gate-source voltage of the transistor Tr3 becomes $V_{EVE}$−VSSL; hence, the transistor Tr3 can be turned on when VSSL is set to satisfy $V_{EVE}$−VSSL>$V_{TH3}$.

At this time, the gate-source voltage of the transistor Tr2 becomes VSSL+α(VDD−VSS)—VSSL=α(VDD−VSS). Here, the transistor Tr2 is turned on when $V_{TH2}$ satisfies α(VDD−VSS)>$V_{TH2}$.

The transistor Tr2 and the transistor Tr3 are turned on, whereby electrical continuity is established between the wiring BOTE and the wiring VLSE. Thus, VDDH stored in the wiring BOTE is discharged down to VSSL, which is supplied from the wiring VLSE. As a result, the wiring BOTE outputs VSSL.

After VSSL is output from the wiring BOTE, VSSL as the low-level potential is input to the wiring EVE. Thus, VSSL is input to the gate of the transistor Tr3. When VSSL is input to the gate of the transistor Tr3, the gate-source voltage of the transistor Tr3 becomes VSSL−VSSL=0. Since 0<$V_{TH3}$, the transistor Tr3 is turned off

[Precharge Period (2) and Data Input Period (2)]

Between Time T6 and Time T7, the wiring BOTE is precharged with a potential. Specifically, between Time T6 and Time T7, the operation in the period between Time T3 and Time T4 is performed in a similar manner. Hence, VDDH+$V_{TH1}$ as the high-level potential is input to the wiring PRCE, and the potential of the wiring BOTE becomes VDDH.

After the wiring BOTE is precharged with the potential, VSSL as the low-level potential is input to the wiring PRCE.

Between Time T6 and Time T7, data is input to the level shifter 100. Specifically, between Time T6 and Time T7, VSS as the low-level potential is input to the wiring INE.

When VSS is input to the wiring INE, the potential of the node FN is changed by capacitive coupling of the capacitor C1. Since the potential of the wiring INE is VSS at this time, the potential of the node FN is returned to the potential of the node FN between Time T2 and Time T3. That is, the potential of the node FN between Time T6 and Time T7 becomes VSSL.

Note that the timing of inputting data to the level shifter 100 is preferably between Time T6 and Time T7, further preferably in a period during which VDDH is input to the wiring PRCE. In other words, VSS is preferably input to the wiring INE while the wiring BOTE is precharged with VDDH.

[Non-Overlap Period (2)]

A period between Time T7 to Time T8 is a non-overlap period, like the period between Time T4 and Time T5. Therefore, the description of the operation between Time T4 and Time T5 is referred to for the non-overlap period.

[Evaluation Period (2)]

Between Time T8 and Time T9, a signal input to the wiring INE is evaluated. Specifically, between Time T8 and Time T9, VDDH+$V_{TH3}$ as the high-level potential is input to the wiring EVE. Thus, the transistor Tr3 is turned on as in the operation between Time T5 and Time T6. Accordingly, VSSL supplied from the wiring VLSE is input to the second terminal of the transistor Tr2.

At this time, the gate-source voltage of the transistor Tr2 becomes VSSL−VSSL=0. Since 0<$V_{TH2}$, the transistor Tr2 is turned off. Hence, the potential of the wiring BOTE remains at VDDH, which has been stored between Time T6 and Time T7. As a result, the wiring BOTE outputs VDDH.

After VDDH is output from the wiring BOTE, VSSL as the low-level potential is input to the wiring EVE. Thus, the transistor Tr3 is turned off.

By the above-described operation example, input VDD can be level-shifted to VSSL, which is lower than VSS, or input VSS can be level-shifted to VDDH, which is higher than VDD.

Note that the semiconductor device of one embodiment of the present invention is not limited to the configuration in FIG. 1. The semiconductor device of one embodiment of the present invention may have a circuit configuration changed from that of the level shifter 100 illustrated in FIG. 1 depending on the situation.

Figure 3:
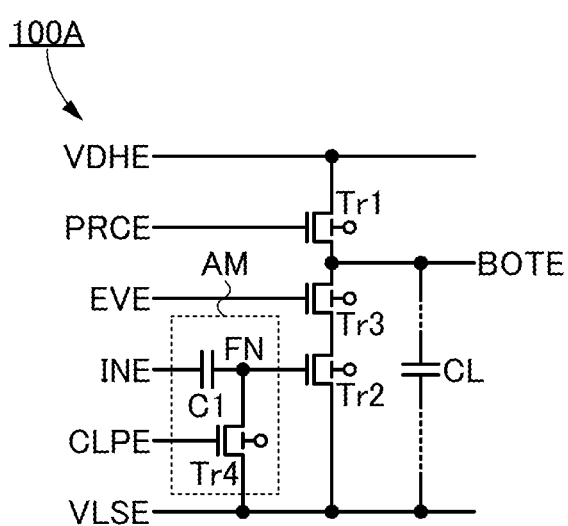
FIG. 3 is a circuit diagram illustrating a configuration example of a semiconductor device.

For example, the circuit configuration of the level shifter 100 illustrated in FIG. 1 may be changed to that of a level shifter 100A illustrated in FIG. 3. Specifically, in the level shifter 100A, the transistor Tr2 and the transistor Tr3 are replaced with each other in the level shifter 100.

Only differences of the circuit configuration of the level shifter 100A in FIG. 3 from that of the level shifter 100 in FIG. 1 will be described. The first terminal of the transistor Tr1 is electrically connected to the first terminal of the transistor Tr3; the second terminal of the transistor Tr3 is electrically connected to the first terminal of the transistor Tr2; and the second terminal of the transistor Tr2 is electrically connected to the wiring VLSE.

An operation example of the level shifter 100A in FIG. 3 can be similar to the timing chart in FIG. 2, which is the operation example of the level shifter 100 in FIG. 1, for example.

Figure 4A:
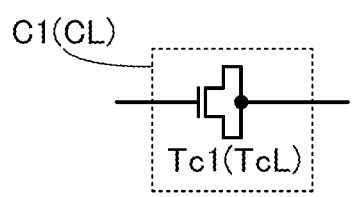
FIG. 4A is a circuit diagram illustrating a configuration example of a capacitor.
Figure 4B:
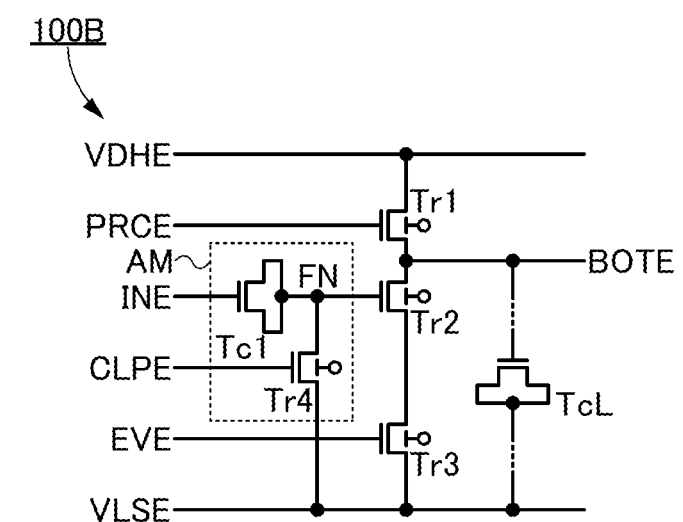
FIG. 4B is a circuit diagram illustrating a configuration example of a semiconductor device.

As another example, the capacitor C1 and the capacitor CL in the level shifter 100 illustrated in FIG. 1 may each include a transistor. In FIG. 4A, the capacitor C1 (the capacitor CL) includes a transistor Tc1 (a transistor TcL). Specifically, a first terminal and a second terminal of the transistor Tc1 (the transistor TcL) serve as one of the first terminal and the second terminal of the capacitor C1 (the capacitor CL), and a gate of the transistor Tc1 (the transistor TcL) serves as the other of the first terminal and the second terminal of the capacitor C1 (the capacitor CL). In other words, the transistor Tc1 is substituted for the capacitor C1 with the use of the gate capacitance of the transistor Tc1, and similarly, the transistor TcL is substituted for the capacitor CL with the use of the gate capacitance of the transistor TcL. In a level shifter 100B illustrated in FIG. 4B, the capacitor C1 and the capacitor CL are replaced with the transistor Tc1 and the transistor TcL, respectively. Note that the threshold voltage of the transistor Tc1 (the transistor TcL) is preferably lower than the voltage between the gate of the transistor Tc1 (the transistor TcL) and the source or drain of the transistor Tc1 (the transistor TcL). In the level shifter 100B illustrated in FIG. 4B, the transistor Tc1 (the transistor TcL) can be fabricated as the capacitor C1 (the capacitor CL) in the steps of forming the transistors; thus, the steps of forming a planar or trench capacitor or the like can be omitted. In other words, the time required for manufacturing the level shifter 100B can be shortened.

Figure 5:
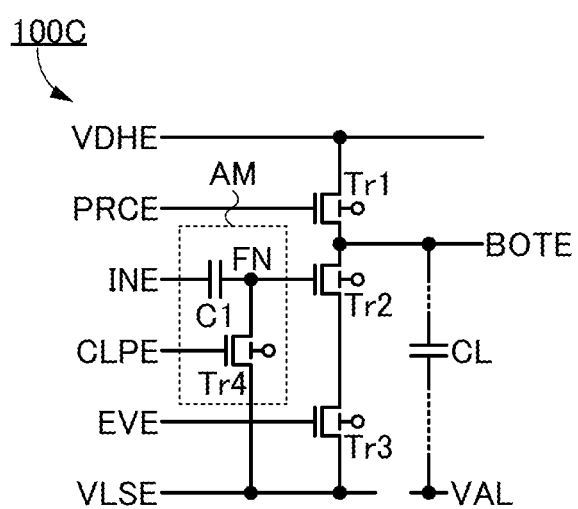
FIG. 5 is a circuit diagram illustrating a configuration example of a semiconductor device.

As another example, in the level shifter 100 illustrated in FIG. 1, the second terminal of the capacitor CL may be electrically connected to another wiring instead of the wiring VLSE. Such a configuration can be, for example, a configuration of a level shifter 100C illustrated in FIG. 5. The level shifter 100C differs from the level shifter 100 in that the second terminal of the capacitor CL is electrically connected to a wiring VAL. Like the wiring VLSE, the wiring VAL functions as a wiring that supplies a constant voltage. Note that the constant voltage can be VSS, a ground potential (GND), or the like instead of VSSL, which the wiring VLSE supplies. Alternatively, depending on the situation, the wiring VAL may be a wiring that supplies a voltage such as VDD or VDDH. Alternatively, the wiring VAL may be electrically connected to the wiring VDHE.

Note that this embodiment can be combined with any of the other embodiments in this specification as appropriate.

Embodiment 2

This embodiment will describe structure examples of the semiconductor device described in the above embodiment and structure examples of a transistor that can be applied to the semiconductor device.

<Structure Example of Semiconductor Device>

Figure 6:
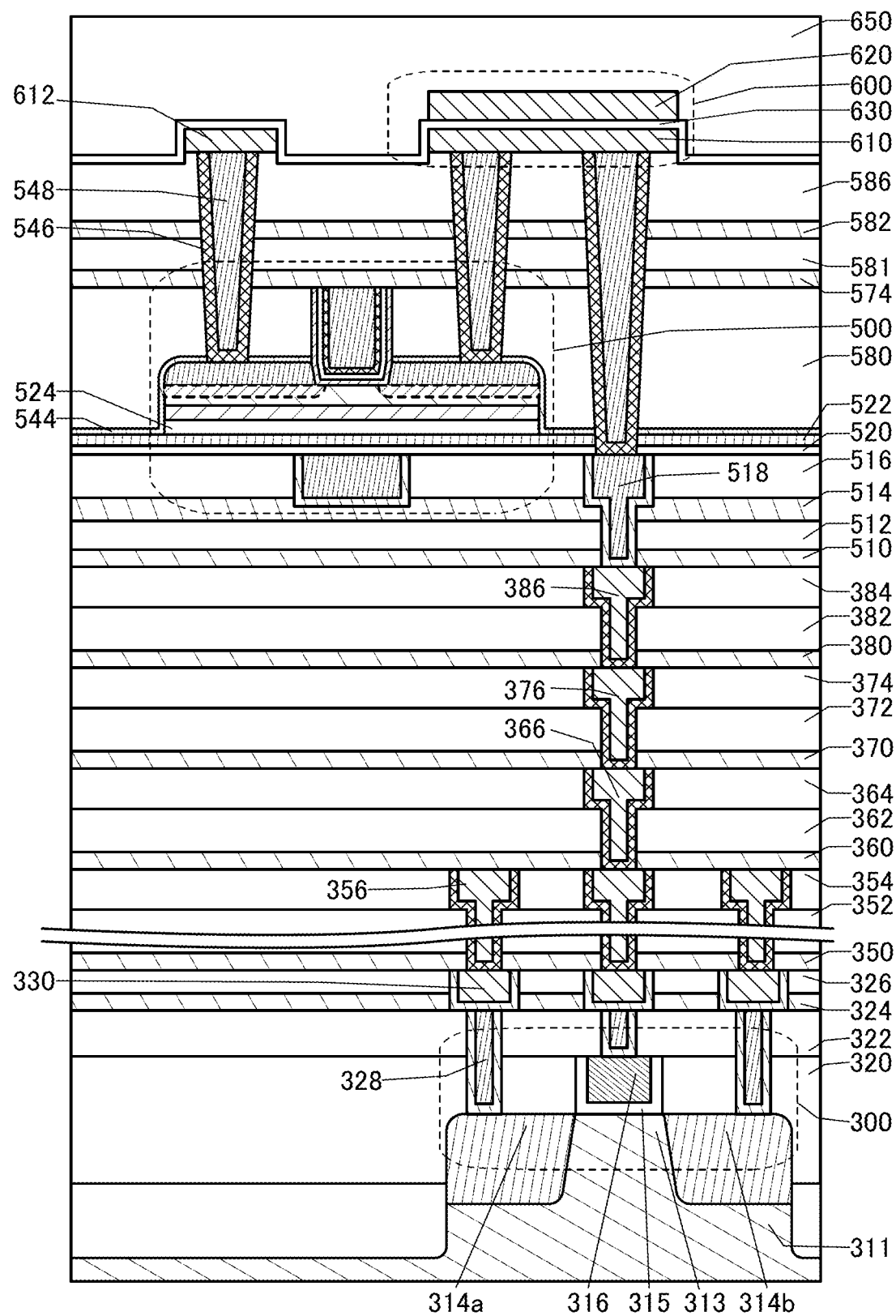
FIG. 6 is a schematic cross-sectional view illustrating a structure example of a semiconductor device.
Figure 8A:
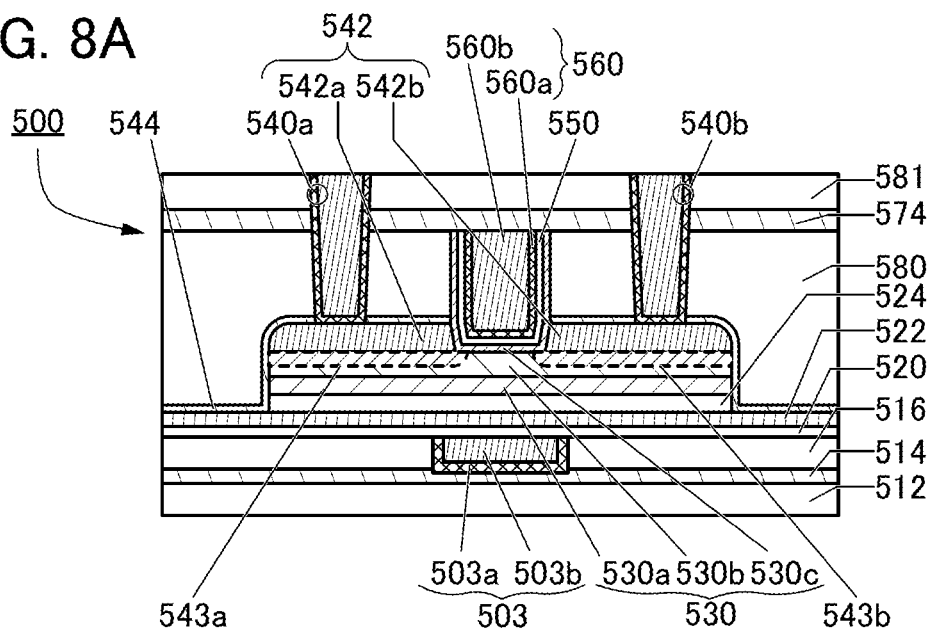
FIG. 8A to FIG. 8C are schematic cross-sectional views illustrating structure examples of transistors.
Figure 8B:
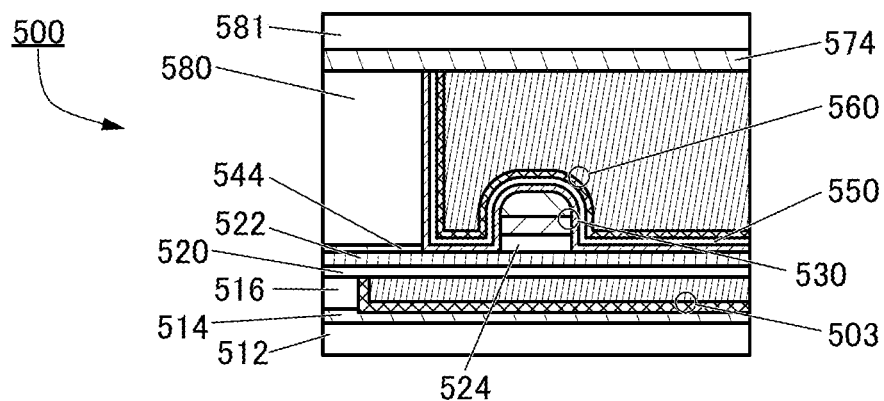
Figure 8C:
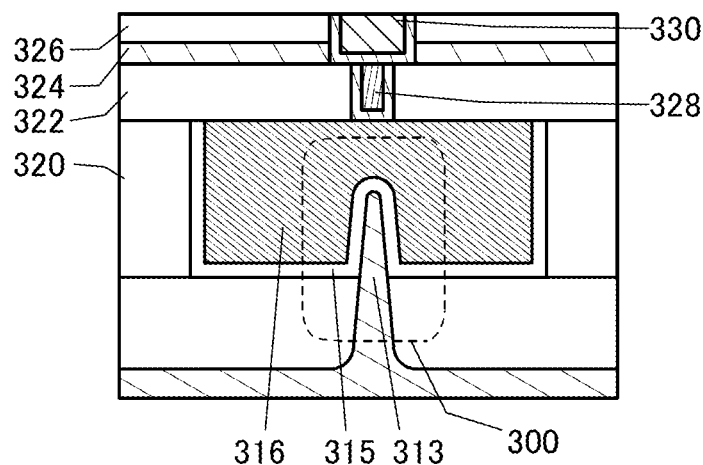

A semiconductor device illustrated in FIG. 6 includes a transistor 300, a transistor 500, and a capacitor 600. FIG. 8A is a cross-sectional view of the transistor 500 in the channel length direction, FIG. 8B is a cross-sectional view of the transistor 500 in the channel width direction, and FIG. 8C is a cross-sectional view of the transistor 300 in the channel width direction.

The transistor 500 is a transistor including a metal oxide in a channel formation region (an OS transistor). The transistor 500 has features that the off-state current is low and the field-effect mobility does not change even at high temperatures. The transistor 500 is used as a transistor included in a semiconductor device, for example, the level shifter 100, the level shifter 100A, the level shifter 100B, the level shifter 100C, and the like described in the above embodiment, whereby a semiconductor device whose operating capability does not deteriorate even at a high temperature can be obtained. In particular, when the transistor 500 is used as the transistor Tr4, a potential written to the node FN in the memory portion AM can be retained for a long time by utilizing the feature of a low off-state current.

In the semiconductor device illustrated in FIG. 6, the transistor 500 is provided above the transistor 300, for example, and the capacitor 600 is provided above the transistor 300 and the transistor 500, for example. The capacitor 600 can be used as the capacitor and the like included in the level shifter 100, the level shifter 100A, the level shifter 100B, the level shifter 100C, and the like described in the above embodiment. Note that depending on a circuit configuration, the capacitor 600 illustrated in FIG. 6 is not necessarily provided.

The transistor 300 is provided over a substrate 311 and includes a conductor 316, an insulator 315, a semiconductor region 313 that is part of the substrate 311, and a low-resistance region 314a and a low-resistance region 314b functioning as a source region and a drain region. Note that the transistor 300 can be used as, for example, the transistor included in the level shifter 100, the level shifter 100A, the level shifter 100B, the level shifter 100C, and the like described in the above embodiment. Specifically, for example, the transistor 300 can be used as the transistor Tr2 included in the level shifter 100 in FIG. 1. Note that FIG. 6 illustrates a structure where a gate of the transistor 300 is electrically connected to one of a source and a drain of the transistor 500 through one of a pair of electrodes of the capacitor 600. However, depending on the configurations of the level shifter 100, the level shifter 100A, the level shifter 100B, the level shifter 100C, and the like, it is possible to employ a structure where one of a source and a drain of the transistor 300 is electrically connected to one of the source and the drain of the transistor 500 through one of the pair of electrodes of the capacitor 600, a structure where one of the source and the drain of the transistor 300 is electrically connected to a gate of the transistor 500 through one of the pair of electrodes of the capacitor 600, or a structure where the terminals of the transistor 300 are not electrically connected to the terminals of the transistor 500 and the terminals of the capacitor 600.

A semiconductor substrate (e.g., a single crystal substrate or a silicon substrate) is preferably used as the substrate 311.

In the transistor 300, a top surface and a side surface in the channel width direction of the semiconductor region 313 are covered with the conductor 316 with the insulator 315 therebetween, as illustrated in FIG. 8C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 7:
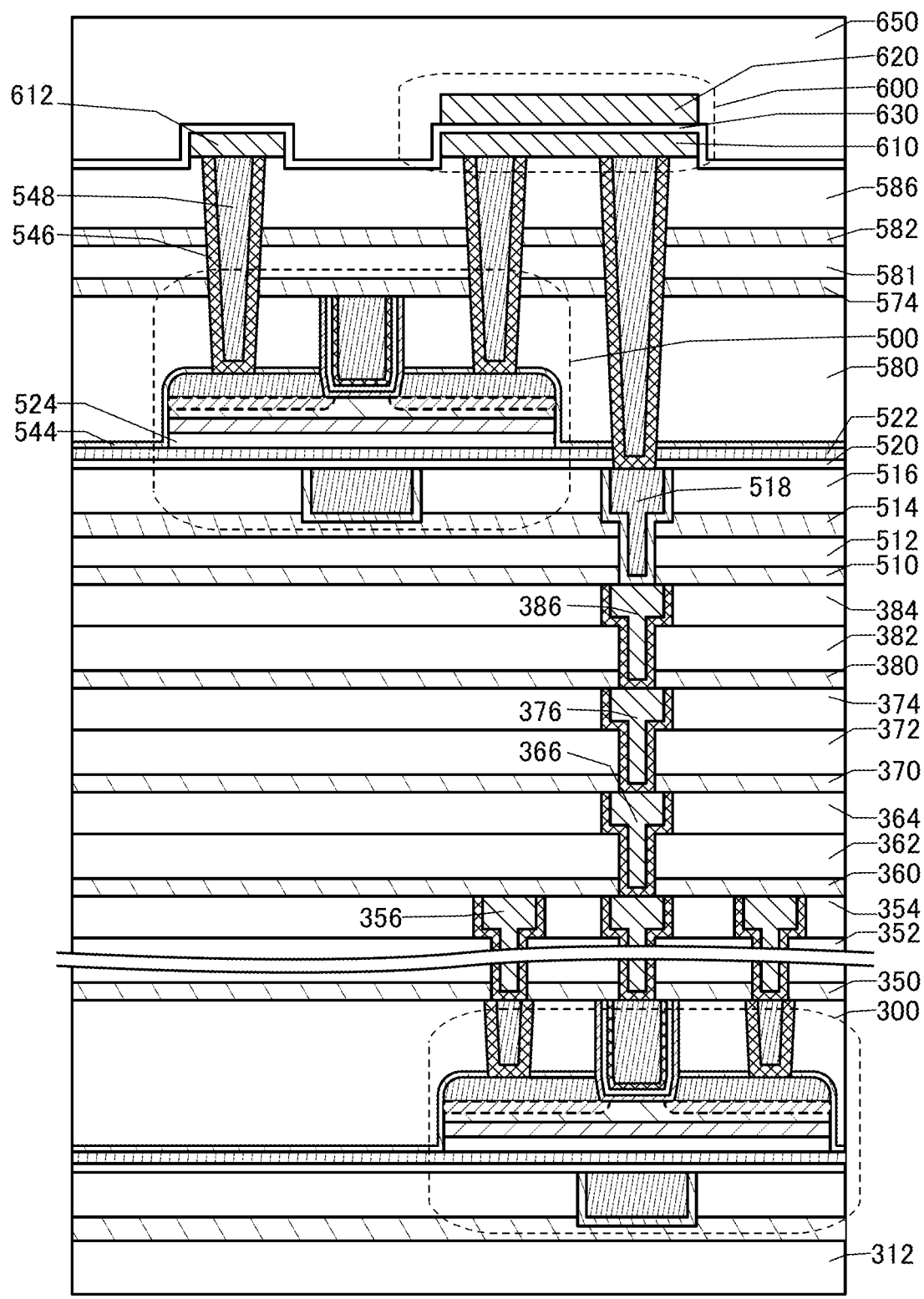
FIG. 7 is a schematic cross-sectional view illustrating a structure example of a semiconductor device.

Note that the transistor 300 illustrated in FIG. 6 is only an example and the structure is not limited thereto; an appropriate transistor can be used in accordance with a circuit configuration, a driving method, or the like. For example, when a semiconductor device is configured as a single-polarity circuit using only OS transistors, the transistor 300 can have a structure similar to that of the transistor 500 using an oxide semiconductor, as illustrated in FIG. 7. Note that the details of the transistor 500 will be described later.

Note that in FIG. 7, the transistor 300 is provided over a substrate 312; in this case, a semiconductor substrate may be used as the substrate 312 as in the case of the substrate 311 in the semiconductor device in FIG. 6. As the substrate 312, it is possible to use, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, or a base material film. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

An insulator 320, an insulator 322, an insulator 324, and an insulator 326 are provided to be stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to improve planarity.

As the insulator 324, it is preferable to use a film having a barrier property that prevents diffusion of hydrogen, impurities, or the like from the substrate 311, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for the interlayer film, parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 6, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those of the conductor 328 and the conductor 330.

For example, like the insulator 324, the insulator 350 is preferably formed using an insulator having a barrier property against hydrogen. The conductor 356 preferably includes a conductor having a barrier property against hydrogen. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 6, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably includes a conductor having a barrier property against hydrogen. In particular, the conductor having a barrier property against hydrogen is formed in an opening portion included in the insulator 360 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 364 and the conductor 366. For example, in FIG. 6, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 374 and the conductor 376. For example, in FIG. 6, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those of the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by the barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked in this order and provided over the insulator 384. A substance with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen, impurities, or the like from the substrate 311, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents passage of oxygen and impurities such as hydrogen and moisture that would cause a change in the electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 into the transistor 500 can be inhibited.

The transistor 500 is provided above the insulator 516.

As illustrated in FIG. 8A and FIG. 8B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom surface and a side surface of the opening, an insulator 550 positioned on a formation surface of the oxide 530c, and a conductor 560 positioned on a formation surface of the insulator 550. Note that the conductor 542a and the conductor 542b are collectively referred to as a conductor 542 in this specification and the like.

As illustrated in FIG. 8A and FIG. 8B, an insulator 544 is preferably positioned between the insulator 580 and the oxide 530a, the oxide 530b, the conductor 542a, and the conductor 542b. In addition, as illustrated in FIG. 8A and FIG. 8B, the conductor 560 preferably includes a conductor 560a provided on the inner side of the insulator 550 and a conductor 560b provided to be embedded on the inner side of the conductor 560a. Moreover, as shown in FIG. 8A and FIG. 8B, an insulator 574 is preferably positioned over the insulator 580, the conductor 560, and the insulator 550.

Hereinafter, the oxide 530a, the oxide 530b, and the oxide 530c may be collectively referred to as an oxide 530.

The transistor 500 is illustrated to have a structure in which the three layers of the oxide 530a, the oxide 530b, and the oxide 530c are stacked in the region where the channel is formed and in the vicinity thereof; however, one embodiment of the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is illustrated to have a stacked-layer structure of two layers in the transistor 500, one embodiment of the present invention is not limited thereto. For example, the conductor 560 may have a single-layer structure or a stacked-layer structure of three or more layers. The transistor 500 illustrated in FIG. 6, FIG. 8A, and FIG. 8B is an example and the structure is not limited thereto; an appropriate transistor can be used in accordance with a circuit configuration, a driving method, or the like.

Here, the conductor 560 functions as a gate electrode of the transistor, and the conductor 542a and the conductor 542b function as a source electrode and a drain electrode. As described above, the conductor 560 is formed to be embedded in an opening in the insulator 580 and the region between the conductor 542a and the conductor 542b. The positions of the conductor 560, the conductor 542a, and the conductor 542b are selected in a self-aligned manner with respect to the opening in the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

Since the conductor 560 is formed in the region between the conductor 542a and the conductor 542b in a self-aligned manner, the conductor 560 does not include a region overlapping with the conductor 542a or the conductor 542b. Thus, parasitic capacitance formed between the conductor 560 and each of the conductor 542a and the conductor 542b can be reduced. As a result, the transistor 500 can have increased switching speed and excellent frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503a is formed in contact with an inner wall of the opening in the insulator 514 and the insulator 516, and a conductor 503b is formed on the inner side. Although the transistor 500 is illustrated to have a structure in which the conductor 503a and the conductor 503b are stacked, one embodiment of the present invention is not limited thereto. For example, the conductor 503 may be provided as a single layer or to have a stacked-layer structure of three or more layers.

Here, for the conductor 503a, it is preferable to use a conductive material that has a function of inhibiting diffusion of impurities such as a hydrogen atom, a hydrogen molecule, a water molecule, and a copper atom (through which the above impurities are less likely to pass). Alternatively, it is preferable to use a conductive material that has a function of inhibiting diffusion of oxygen (e.g., at least one of an oxygen atom, an oxygen molecule, and the like) (through which the oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

When the conductor 503 also functions as a wiring, a conductive material with high conductivity that contains tungsten, copper, or aluminum as its main component is preferably used for the conductor 503b. In the case where the conductivity of the wiring can be kept high, in that case, the conductor 503a is not necessarily provided. Note that the conductor 503b is illustrated as a single layer but may have a stacked-layer structure, for example, a stack of titanium or titanium nitride and any of the above conductive materials.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of V$_O$H is cut occurs, i.e., a reaction of "V$_O$H→V$_O$+H" occurs. Part of hydrogen generated at this time is bonded to oxygen to be H$_2$O, and removed from the oxide 530 or an insulator near the oxide 530 in some cases. Part of hydrogen is diffused into or gettered (also referred to as gettering) by the conductor 542a and the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio (O$_2$/(O$_2$+Ar)) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (V$_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "V$_O$+O→null". Furthermore, hydrogen remaining in the oxide 530 reacts with supplied oxygen, so that the hydrogen can be removed as H$_2$O (dehydration). This can inhibit recombination of hydrogen remaining in the oxide 530 with oxygen vacancies and formation of V$_O$H.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen, impurities or the like, oxygen contained in the oxide 530 is not diffused to the insulator 520 side, which is preferable. Furthermore, the conductor 503 can be inhibited from reacting with oxygen contained in the insulator 524, the oxide 530, or the like.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be lowered while the physical thickness is maintained.

It is particularly preferable to use an insulator containing an oxide of one or both of aluminum and hafnium, which is an insulating material that has a function of inhibiting diffusion of impurities, oxygen, and the like (through which the oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

In addition, it is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high dielectric constant can be obtained.

Note that in the transistor 500 in FIG. 8A and FIG. 8B, the insulator 520, the insulator 522, and the insulator 524 are shown as the second gate insulating film having a stacked-layer structure of three layers; alternatively, the second gate insulating film may be a single layer or may have a stacked-layer structure of two layers or four or more layers. In that case, the stacked layers are not necessarily formed of the same material and may be formed of different materials.

In the transistor 500, a metal oxide functioning as an oxide semiconductor is preferably used for the oxide 530 including the channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide that can be used as the oxide 530 is preferably a CAAC-OS (C-Axis Aligned Crystalline Oxide Semiconductor) or a CAC-OS (Cloud-Aligned Composite Oxide Semiconductor). Alternatively, an In—Ga oxide, an In—Zn oxide, an In oxide, or the like may be used as the oxide 530.

Furthermore, a metal oxide with a low carrier concentration is preferably used for the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form $V_OH$ in some cases. The $V_OH$ serves as a donor and an electron serving as a carrier is generated in some cases. In some cases, bonding of part of hydrogen to oxygen bonded to a metal atom generates electrons serving as carriers. Thus, a transistor using a metal oxide containing a large amount of hydrogen is likely to have normally-on characteristics. Moreover, hydrogen in a metal oxide easily moves by stress such as heat and an electric field; thus, the reliability of a transistor may be low when the metal oxide contains a large amount of hydrogen. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose $V_OH$ is sufficiently reduced. When a metal oxide in which impurities such as $V_OH$ are sufficiently reduced is used for a channel formation region of a transistor, stable electrical characteristics can be given.

A defect that is an oxygen vacancy into which hydrogen has entered can function as a donor of a metal oxide. However, it is difficult to evaluate the defects quantitatively. Thus, the metal oxide is sometimes evaluated in terms of not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

In the case where a metal oxide is used as the oxide 530, the metal oxide is an intrinsic (also referred to as i-type) or substantially intrinsic semiconductor that has a large band gap, and the carrier concentration of the metal oxide in the channel formation region is preferably lower than $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

In the case where a metal oxide is used as the oxide 530, contact between the oxide 530 and each of the conductor 542a and the conductor 542b may diffuse oxygen in the oxide 530 into the conductor 542a and the conductor 542b, resulting in oxidation of the conductor 542a and the conductor 542b in some cases. It is highly possible that oxidation of the conductor 542a and the conductor 542b lowers the conductivity of the conductor 542a and the conductor 542b. Note that diffusion of oxygen in the oxide 530 into the conductor 542a and the conductor 542b can be rephrased as absorption of oxygen in the oxide 530 by the conductor 542a and the conductor 542b.

When oxygen in the oxide 530 diffuses into the conductor 542a and the conductor 542b, a different layer is sometimes formed between the conductor 542a and the oxide 530b and between the conductor 542b and the oxide 530b. The different layer contains a larger amount of oxygen than the conductor 542a and the conductor 542b and thus presumably has an insulating property. In this case, a three-layer structure of the conductor 542a or the conductor 542b, the different layer, and the oxide 530b can be regarded as a three-layer structure of a metal, an insulator, and a semiconductor and is sometimes referred to as a MIS (Metal- Insulator-Semiconductor) structure or referred to as a diode-connected structure mainly formed of the MIS structure.

Note that the different layer is not necessarily formed between the oxide 530b and each of the conductor 542a and the conductor 542b; for example, the different layer may be formed between the oxide 530c and each of the conductor 542a and the conductor 542b, between the oxide 530b and each of the conductor 542a and the conductor 542b, or between the oxide 530c and each of the conductor 542a and the conductor 542b.

The metal oxide functioning as the channel formation region in the oxide 530 has a band gap of preferably 2 eV or more, further preferably 2.5 eV or more. The use of a metal oxide having a wide band gap can reduce the off-state current of the transistor.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic ratio of the element M to the constituent elements in the metal oxide used for the oxide 530a is preferably higher than the atomic ratio of the element M to the constituent elements in the metal oxide used for the oxide 530b. The atomic ratio of the element M to In in the metal oxide used for the oxide 530a is preferably higher than the atomic ratio of the element M to In in the metal oxide used for the oxide 530b. The atomic ratio of In to the element M in the metal oxide used for the oxide 530b is preferably higher than the atomic ratio of In to the element M in the metal oxide used for the oxide 530a. Moreover, a metal oxide that can be used as the oxide 530a or the oxide 530b can be used as the oxide 530c.

Specifically, as the oxide 530a, a metal oxide in which an atomic ratio of In to Ga and Zn is In:Ga:Zn=1:3:4 or 1:1:0.5 is used. As the oxide 530b, a metal oxide in which an atomic ratio of In to Ga and Zn is In:Ga:Zn=4:2:3 or 1:1:1 is used. As the oxide 530c, a metal oxide in which an atomic ratio of In to Ga and Zn is In:Ga:Zn=1:3:4 or an atomic ratio of Ga to Zn is Ga:Zn=2:1 or Ga:Zn=2:5 is used. Specific examples of the case where the oxide 530c has a stacked-layer structure include a stacked-layer structure of a layer in which an atomic ratio of In to Ga and Zn is In:Ga:Zn=4:2:3 and a layer with In:Ga:Zn=1:3:4; a stacked-layer structure of a layer in which an atomic ratio of Ga to Zn is Ga:Zn=2:1 and a layer in which an atomic ratio of In to Ga and Zn is In:Ga:Zn=4:2:3; a stacked-layer structure of a layer in which an atomic ratio of Ga to Zn is Ga:Zn=2:5 and a layer in which an atomic ratio of In to Ga and Zn is In:Ga:Zn=4:2:3; and a stacked-layer structure of gallium oxide and a layer in which an atomic ratio of In to Ga and Zn is In:Ga:Zn=4:2:3.

For example, in the case where the atomic ratio of In to the element M in the metal oxide used as the oxide 530a is lower than the atomic ratio of In to the element M in the metal oxide used as the oxide 530b, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof, or the like can be used as the oxide 530b.

As the oxide 530b, it is also possible to use a metal oxide having a composition of In:Zn=2:1, a composition of In:Zn=5:1, a composition of In:Zn=10:1, or a composition in the neighborhood of any one of these compositions, other than the above-described compositions.

The oxide 530a, the oxide 530b, and the oxide 530c are preferably combined to satisfy the above relation of the atomic ratios. For example, it is preferable that the oxide 530a and the oxide 530c each be a metal oxide having a composition of In:Ga:Zn=1:3:4 or a composition in the neighborhood thereof and the oxide 530b be a metal oxide having a composition of In:Ga:Zn=4:2:3 to 4:2:4.1 or a composition in the neighborhood thereof. Note that the above composition represents the atomic ratio of an oxide formed over a base or the atomic ratio of a sputtering target. Moreover, it is suitable that the proportion of In is increased in the composition of the oxide 530b because the transistor can have a higher on-state current, higher field-effect mobility, or the like.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element as its component; an alloy containing any of the above metal elements in combination; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

The conductor 542a and the conductor 542b are illustrated to have a single-layer structure in FIG. 8A and FIG. 8B, but may have a stacked-layer structure of two or more layers. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 8A, a region 543a and a region 543b are sometimes formed as low-resistance regions at the interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover side surfaces of the oxide 530 and the insulator 524 and to be in contact with the insulator 522.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, impurities such as water and hydrogen contained in the insulator 580 can be inhibited from diffusing into the oxide 530b through the oxide 530c and the insulator 550. Furthermore, oxidation of the conductor 560 due to excess oxygen contained in the insulator 580 can be inhibited.

The insulator 550 functions as a first gate insulating film. The insulator 550 is preferably placed in contact with the inner side (the top surface and the side surface) of the oxide 530c. Like the insulator 524, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each containing excess oxygen. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 into the conductor 560. Providing the metal oxide that inhibits diffusion of oxygen inhibits diffusion of excess oxygen from the insulator 550 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film; for that reason, when the insulator functioning as the gate insulating film has a stacked-layer structure of a high-k material and a thermally stable material, a gate potential during transistor operation can be lowered while the physical thickness is kept. Furthermore, the stacked-layer structure can be thermally stable and have a high relative permittivity.

Although the conductor 560 functioning as the first gate electrode has a two-layer structure in FIG. 8A and FIG. 8B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (N$_2$O, NO, NO$_2$, and the like), and a copper atom. Alternatively, it is preferable to use a conductive material having a function of inhibiting diffusion of oxygen (e.g., at least one of an oxygen atom and an oxygen molecule). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used for the oxide 530 can be used. In that case, when the conductor 560b is deposited by a sputtering method, the conductor 560a can have a reduced value of electrical resistance to be a conductor. Such a conductor can be referred to as an OC (Oxide Conductor) electrode.

A conductive material containing tungsten, copper, or aluminum as its main component is preferably used for the conductor 560b. Furthermore, the conductor 560b also functions as a wiring, and thus a conductor having high conductivity is preferably used for the conductor 560b. For example, a conductive material containing tungsten, copper, or aluminum as its main component can be used. Moreover, the conductor 560b may have a stacked-layer structure, for example, a stacked-layer structure of titanium or titanium nitride and the above conductive material.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be small for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is formed by a sputtering method, excess-oxygen regions can be provided in the insulator 550 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably reduced.

A conductor 540a and a conductor 540b are placed in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that are described later.

An insulator 582 is provided over the insulator 581. A substance having a barrier property against oxygen, hydrogen, or the like is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture, which are factors of a change in electrical characteristics of the transistor. Accordingly, aluminum oxide can prevent mixing of impurities such as hydrogen and moisture into the transistor 500 in the manufacturing process and after manufacturing of the transistor. In addition, release of oxygen from the oxide included in the transistor 500 can be inhibited. Therefore, aluminum oxide is suitably used for the protective film of the transistor 500.

An insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

Note that after the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. In the case where an opening is formed to surround the transistor 500, for example, formation of an opening reaching the insulator 514 or the insulator 522 and the formation of the insulator having a high barrier property in contact with the insulator 514 or the insulator 522 are suitable because these formation steps can also serve as some of the manufacturing steps of the transistor 500. For the insulator having a high barrier property against hydrogen or water, a material similar to that for the insulator 522 can be used, for example.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 6; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a semiconductor device using a transistor including an oxide semiconductor can be miniaturized or highly integrated.

Figure 9:
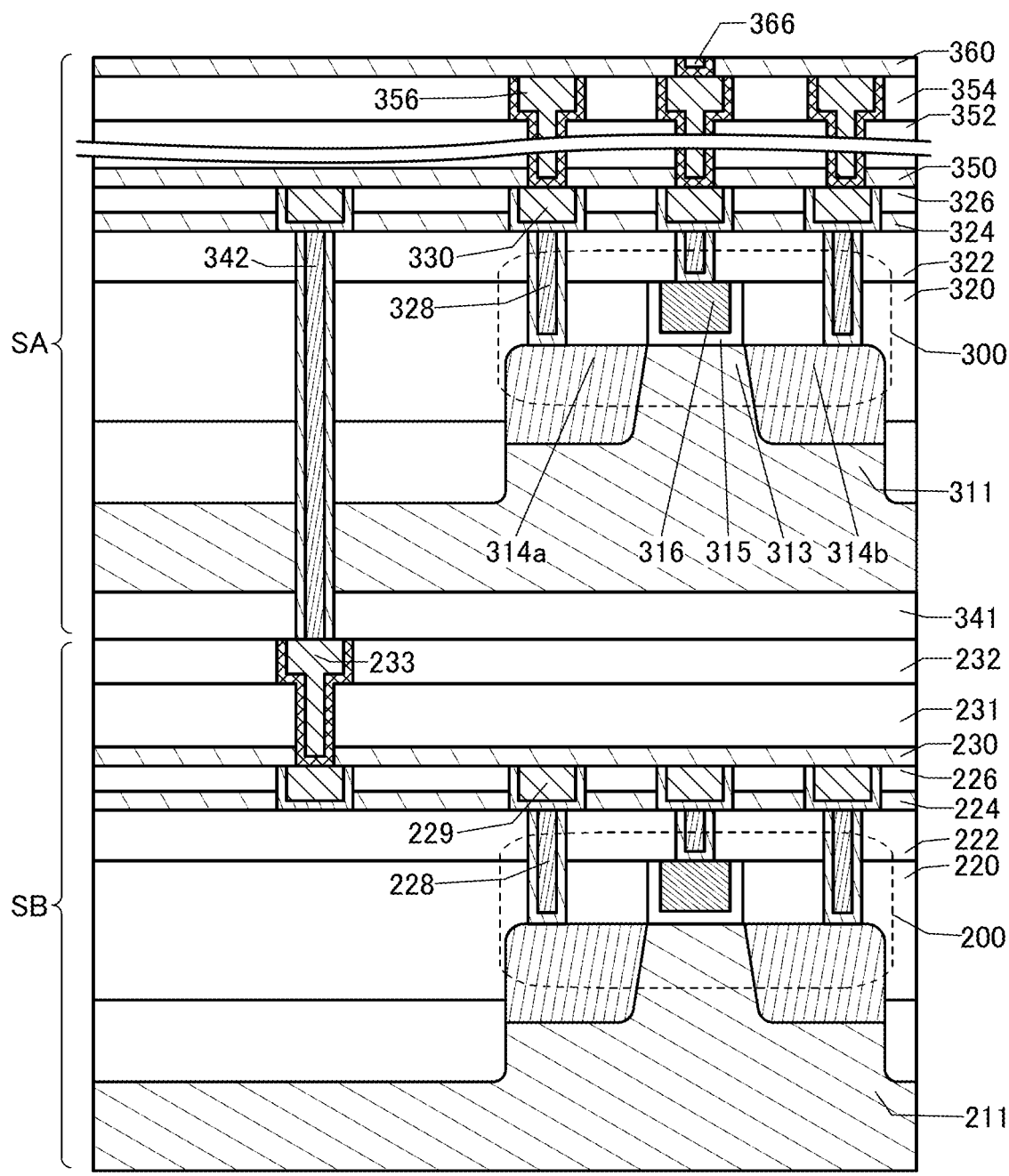
FIG. 9 is a schematic cross-sectional view illustrating a structure example of a semiconductor device.

Note that in the semiconductor device of one embodiment of the present invention, for example, another semiconductor substrate where a circuit is formed may be attached below the substrate 311 where the transistor 300 is formed. FIG. 9 illustrates a structure in which a layer SA that is part of the semiconductor device in FIG. 6 and a layer SB in which a circuit is formed on another semiconductor substrate are attached to each other. Specifically, in the semiconductor device illustrated in FIG. 9, a substrate 211 that is included in the layer SB and provided with a circuit and the like is attached below the substrate 311 included in the layer SA. Note that conductors, insulators, and the like above the insulator 360 in the layer SA are omitted in FIG. 9.

As the substrate 211, a substrate usable as the substrate 311 of the semiconductor device in FIG. 6 can be used, for example.

For example, an insulator 220, an insulator 222, an insulator 224, an insulator 226, and an insulator 230 are provided in this order over the substrate 211 to cover a transistor 200, as in the transistor 300 over the substrate 311.

For the insulator 220, the insulator 222, the insulator 224, the insulator 226, the insulator 230, and an insulator 231, any of the materials usable for the insulator 320, the insulator 322, the insulator 324, the insulator 326, the insulator 230, or the like can be used, for example. The insulator 220, the insulator 222, the insulator 224, the insulator 226, the insulator 230, and the insulator 231 can be formed in a step similar to that for the insulator 320, the insulator 322, the insulator 324, the insulator 326, the insulator 350, or the like, for example.

A conductor 228, a conductor 229, and the like are embedded in the insulator 220, the insulator 222, the insulator 224, and the insulator 226. Like the conductor 328 and the conductor 330, the conductor 228 and the conductor 229 have a function of a plug or a wiring. For the conductor 228 and the conductor 229, any of the materials usable for the conductor 328 and the conductor 330 can be used.

An insulator 232 functions as an attachment layer for an after-mentioned insulator 341 provided below the substrate 311. A conductor 233 is embedded in the insulator 231 and the insulator 232 to be electrically connected to part of the conductor 229, and the conductor 233 also functions as part of the attachment layer.

For example, silicon oxide, silicon oxynitride, silicon nitride oxide, silicon nitride, titanium nitride, or the like can be used for the insulator 232.

For example, copper, aluminum, tin, zinc, tungsten, silver, platinum, gold, or the like can be used for the conductor 233. Copper, aluminum, tungsten, or gold is preferably used in terms of ease of bonding with an after-mentioned conductor 342.

Note that the conductor 233 may have a multilayer structure including a plurality of layers. For example, a first conductor may be formed on a side wall of an opening in the insulator 231 and the insulator 232, and then a second conductor may be formed to fill the opening portion in the insulator 231 and the insulator 232. A conductor having a barrier property against hydrogen, such as tantalum nitride, can be used as the first conductor, for example, and tungsten with high conductivity can be used as the second conductor, for example.

The insulator 341 is formed below the substrate 311. The insulator 341 functions as an attachment layer for the insulator 232 over the substrate 211.

For the insulator 341, any of the materials usable for the insulator 232 can be used, for example. Since the insulator 232 and the insulator 341 are bonded to each other, it is particularly preferable that the insulator 232 and the insulator 341 be formed of the same components.

In the layer SA, the conductor 342 is embedded in the insulator 341, the substrate 311, the insulator 320, and the insulator 322 to be electrically connected to part of the conductor 330, and the conductor 342 also functions as part of the attachment layer.

For the conductor 342, any of the materials usable for the conductor 233 can be used, for example. Since the conductor 342 and the conductor 233 are bonded to each other, it is particularly preferable that the conductor 342 and the conductor 233 be formed using the same metal material.

Note that the conductor 342 may have a multilayer structure including a plurality of layers. For example, a first conductor may be formed on a side wall of an opening in the insulator 341, the substrate 311, the insulator 320, and the insulator 322, and then a second conductor may be formed to fill the opening portion in the insulator 341, the substrate 311, the insulator 320, and the insulator 322. A conductor having a barrier property against hydrogen, such as tantalum nitride, can be used as the first conductor, for example, and tungsten with high conductivity can be used as the second conductor, for example.

Next, bonding between the layer SA and the layer SB will described.

In a step prior to bonding between the layer SA and the layer SB, the surfaces of the insulator 232 and the conductor 233 are planarized to be level with each other in the layer SB. Similarly, the surfaces of the insulator 341 and the conductor 342 are planarized to be level with each other in the layer SA.

In the case where bonding of the insulator 232 and the insulator 341, i.e., bonding of the insulating layers, is performed in the bonding step, a hydrophilic bonding method or the like can be employed in which, after high planarity is obtained by polishing or the like, the surfaces subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When bonding of the conductor 233 and the conductor 342, i.e., bonding of the conductors, is performed, for example, a surface activated bonding method can be used in which an oxide film, a layer adsorbing impurities, and the like on the surface are removed by sputtering processing or the like and the cleaned and activated surfaces are brought into contact to be bonded to each other. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Through the above-described bonding step, the conductor 342 included in the layer SA can be electrically connected to the conductor 233 included in the layer SB. Moreover, it is possible to obtain a mechanically strong connection between the insulator 341 included in the layer SA and the insulator 232 included in the layer SB.

When the layer SA and the layer SB are bonded to each other, the insulating layers and the metal layers coexist on their bonding surfaces; therefore, the surface activated bonding method and the hydrophilic bonding method are performed in combination, for example.

For example, it is possible to use a method in which the surfaces are made clean after polishing, the surfaces of the metal layers are subjected to antioxidant treatment followed by hydrophilicity treatment, and then bonding is performed. Furthermore, hydrophilicity treatment may be performed on the surfaces of the metal layers being a hardly oxidizable metal such as gold. Note that a bonding method other than the above-mentioned methods may be used.

By using the above-described bonding step, a circuit can be additionally provided in the semiconductor device. Thus, an increase in the circuit area of the semiconductor device can be suppressed. In addition, the bonding step enables the semiconductor device to be electrically connected to another semiconductor device (e.g., a logic circuit, a signal converter circuit, a potential level converter circuit, a current source, a voltage source, a switching circuit, an amplifier circuit, a photoelectric conversion circuit, or an arithmetic circuit). Accordingly, a novel semiconductor device can be configured.

Figure 10:
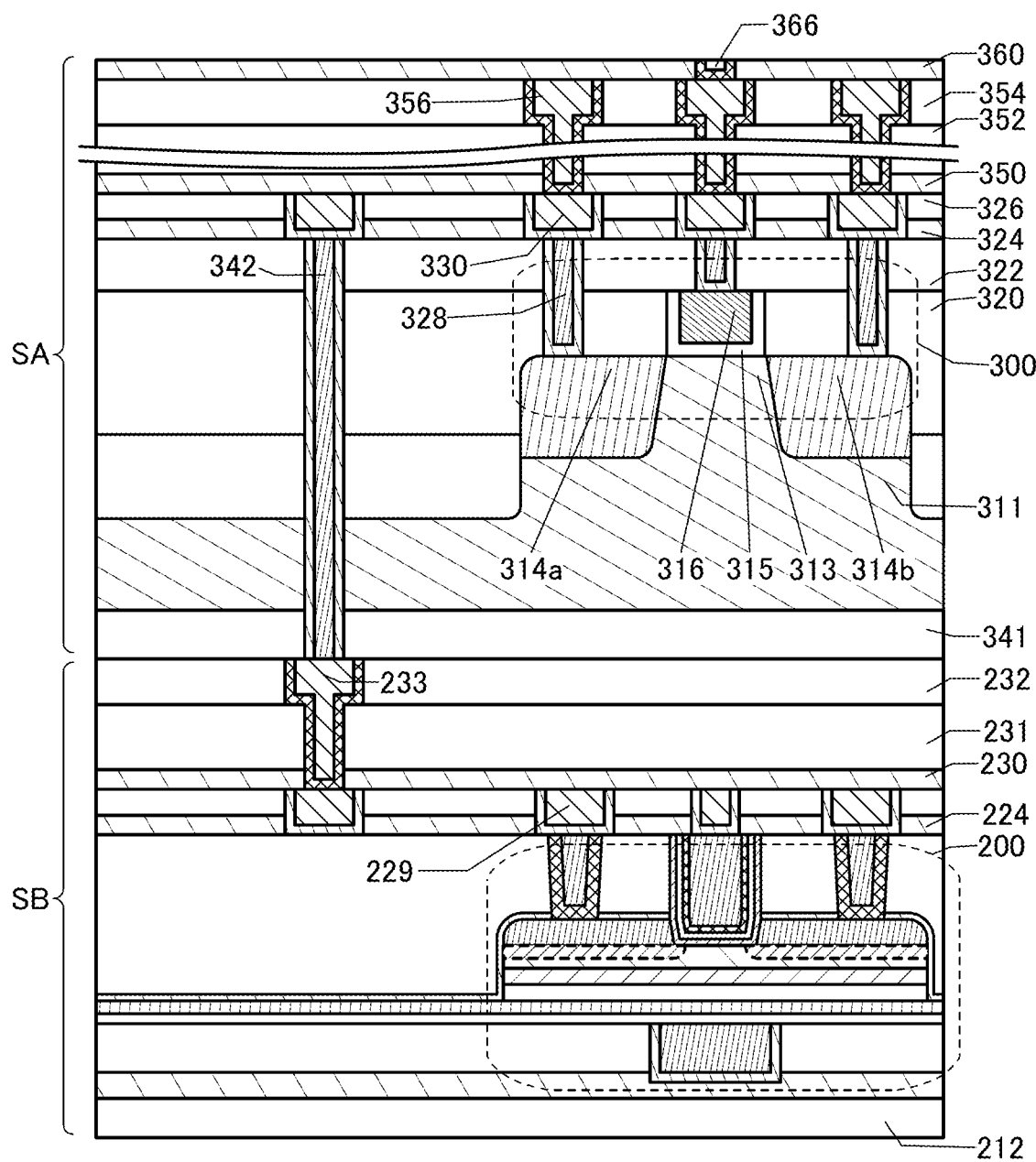
FIG. 10 is a schematic cross-sectional view illustrating a structure example of a semiconductor device.

Note that the transistor 200, for example, is formed on the substrate 211 included in the layer SB. Although FIG. 9 shows an example where the transistor 200 has a structure similar to that of the transistor 300, the transistor 200 may have a structure different from that of the transistor 300. For example, as illustrated in FIG. 10, the transistor 200 may be an OS transistor having the structure of the transistor 500 illustrated in FIG. 6, FIG. 7, FIG. 8A, and FIG. 8B. As a substrate 212 illustrated in FIG. 10, a substrate usable as the substrate 312 of the semiconductor device illustrated in FIG. 7 can be used, for example.

Next, other structure examples of the OS transistor illustrated in FIG. 6 and FIG. 7 will be described.

Figure 11A:
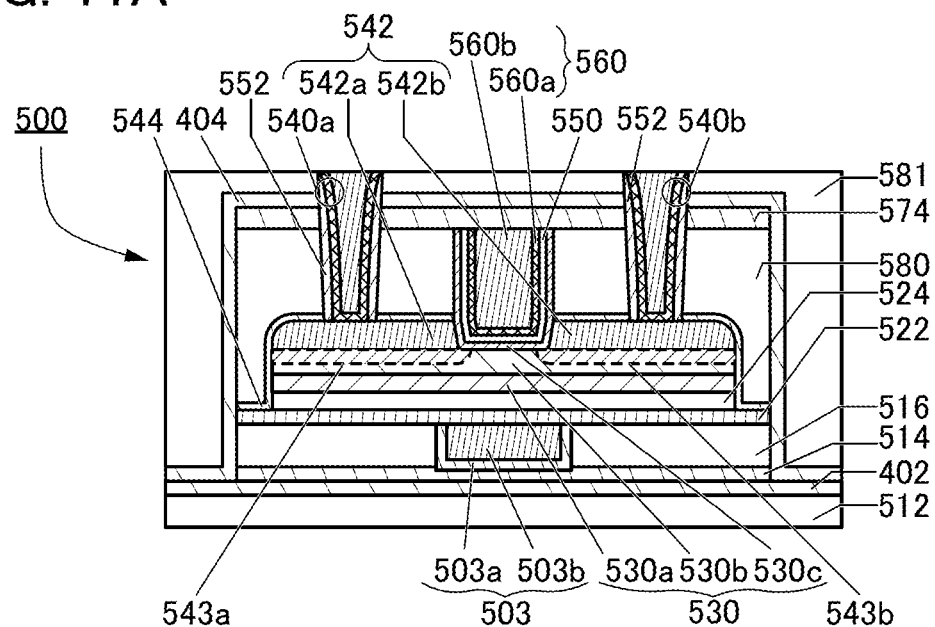
FIG. 11A and FIG. 11B are schematic cross-sectional views illustrating a structure example of a transistor.
Figure 11B:
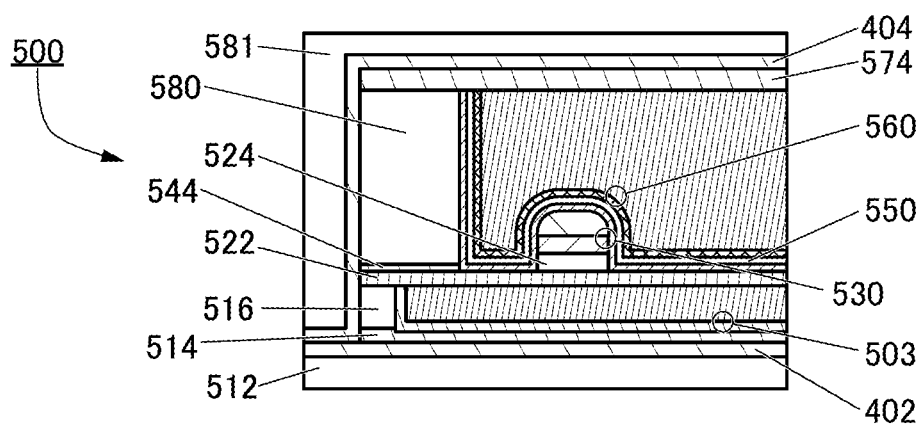

FIG. 11A and FIG. 11B illustrate a variation example of the transistor 500 illustrated in FIG. 8A and FIG. 8B. FIG. 11A is a cross-sectional view of the transistor 500 in the channel length direction, and FIG. 11B is a cross-sectional view of the transistor 500 in the channel width direction. Note that the structure illustrated in FIG. 11A and FIG. 11B can also be applied to other transistors, such as the transistor 300, included in the semiconductor device of one embodiment of the present invention.

The transistor 500 having the structure illustrated in FIG. 11A and FIG. 11B is different from the transistor 500 having the structure illustrated in FIG. 8A and FIG. 8B in including an insulator 402 and an insulator 404. Furthermore, the transistor 500 having the structure illustrated in FIG. 11A and FIG. 11B is different from the transistor 500 having the structure illustrated in FIG. 8A and FIG. 8B in that insulators 552 are provided in contact with a side surface of the conductor 540a and a side surface of the conductor 540b. Moreover, the transistor 500 having the structure illustrated in FIG. 11A and FIG. 11B is different from the transistor 500 having the structure illustrated in FIG. 8A and FIG. 8B in that the insulator 520 is not included.

In the transistor 500 having the structure illustrated in FIG. 11A and FIG. 11B, the insulator 402 is provided over the insulator 512. In addition, the insulator 404 is provided over the insulator 574 and the insulator 402.

In the transistor 500 having the structure illustrated in FIG. 11A and FIG. 11B, the insulator 514, the insulator 516, the insulator 522, the insulator 524, the insulator 544, the insulator 580, and the insulator 574 are provided and covered with the insulator 404. That is, the insulator 404 is in contact with the top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and the top surface of the insulator 402. Thus, the oxide 530 and the like are isolated from the outside by the insulator 404 and the insulator 402.

It is preferable that the insulator 402 and the insulator 404 have high capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide with a high hydrogen barrier property. This can inhibit diffusion of hydrogen or the like into the oxide 530, whereby degradation of the characteristics of the transistor 500 can be inhibited. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride for the insulator 552 because of its high hydrogen barrier property. By using a material having a high hydrogen barrier property for the insulator 552, diffusion of impurities such as water or hydrogen from the insulator 580 and the like into the oxide 530 through the conductor 540a and the conductor 540b can be inhibited. Furthermore, oxygen contained in the insulator 580 can be inhibited from being absorbed by the conductor 540a and the conductor 540b. As described above, the reliability of the semiconductor device of one embodiment of the present invention can be increased.

Figure 12A:
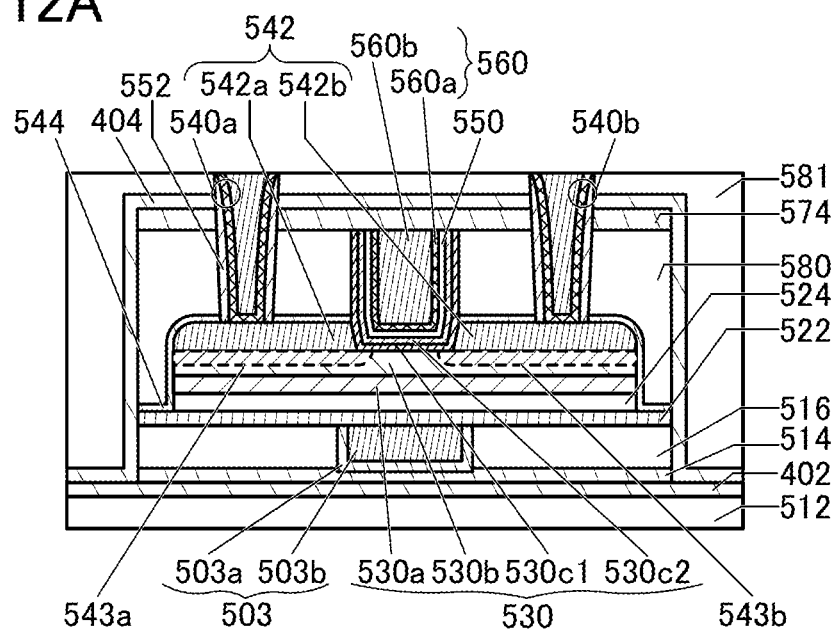
FIG. 12A and FIG. 12B are schematic cross-sectional views illustrating a structure example of a transistor.
Figure 12B:
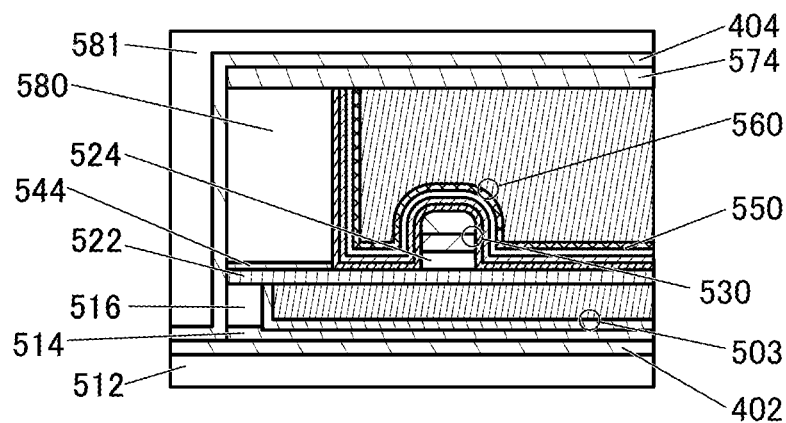

The transistor structure of the transistor 500 illustrated in FIG. 11A and FIG. 11B may be changed according to circumstances. As a variation example of the transistor 500 illustrated in FIG. 11A and FIG. 11B, a transistor illustrated in FIG. 12A and FIG. 12B can be employed, for example. FIG. 12A is a cross-sectional view of the transistor in the channel length direction, and FIG. 12B is a cross-sectional view of the transistor in the channel width direction. The transistor illustrated in FIG. 12A and FIG. 12B is different from the transistor illustrated in FIG. 11A and FIG. 11B in that the oxide 530c has a two-layer structure of an oxide 530c1 and an oxide 530c2.

The oxide 530c1 is in contact with the top surface of the insulator 524, a side surface of the oxide 530a, the top surface and a side surface of the oxide 530b, side surfaces of the conductor 542a and the conductor 542b, a side surface of the insulator 544, and a side surface of the insulator 580. The oxide 530c2 is in contact with the insulator 550.

An In—Zn oxide can be used as the oxide 530c1, for example. For the oxide 530c2, it is possible to use a material similar to the material that can be used for the oxide 530c when the oxide 530c has a single-layer structure. For example, as the oxide 530c2, a metal oxide with In:Ga:Zn=1:3:4 [atomic ratio], Ga:Zn=2:1 [atomic ratio], or Ga:Zn=2:5 [atomic ratio] can be used.

When the oxide 530c has a two-layer structure of the oxide 530c1 and the oxide 530c2, the on-state current of the transistor can be increased as compared with the case where the oxide 530c has a single-layer structure. Thus, the transistor can be used as a power MOS transistor, for example. Note that the oxide 530c included in the transistor having the structure illustrated in FIG. 8A and FIG. 8B can also have a two-layer structure of the oxide 530c1 and the oxide 530c2.

The transistor having the structure illustrated in FIG. 12A and FIG. 12B can be used as the transistor 300 illustrated in FIG. 6 or FIG. 7, for example. In addition, as described above, the transistor 300 can be used, for example, as a transistor included in the semiconductor device described in the above embodiment, such as the level shifter 100, the level of the level shifter 100A, the level shifter 100B, and the level shifter 100C described in the above embodiment. Note that the transistor illustrated in FIG. 12A and FIG. 12B can be employed as a transistor included in the semiconductor device of one embodiment of the present invention, other than the transistor 300 and the transistor 500.

Next, a capacitor that can be used in the semiconductor devices in FIG. 6 and FIG. 7 will be described.

Figure 13A:
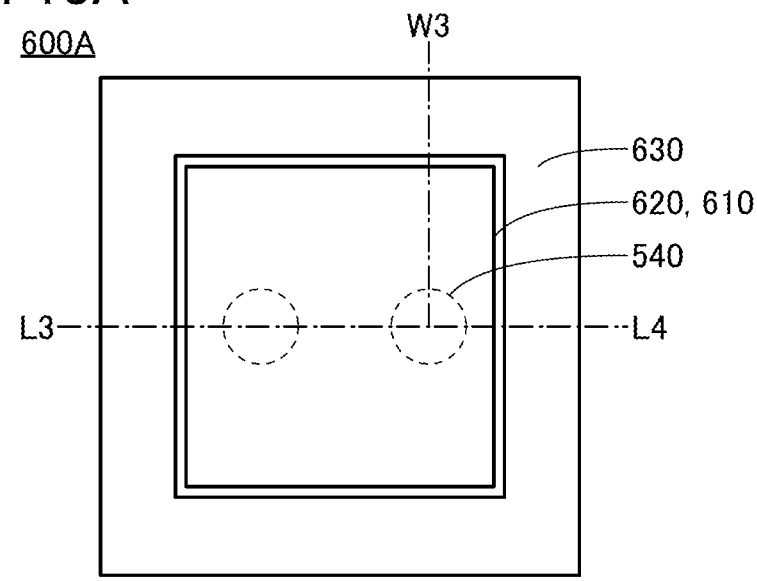
FIG. 13A is a top view illustrating a structure example of a capacitor.
Figure 13B:
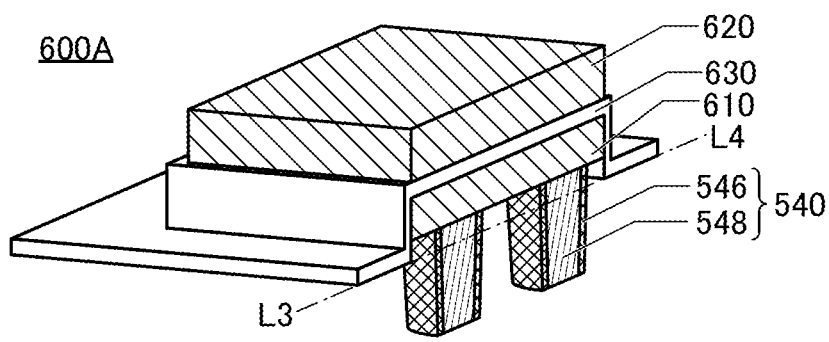
FIG. 13B and FIG. 13C are cross-sectional perspective views illustrating the structure example of the capacitor.
Figure 13C:
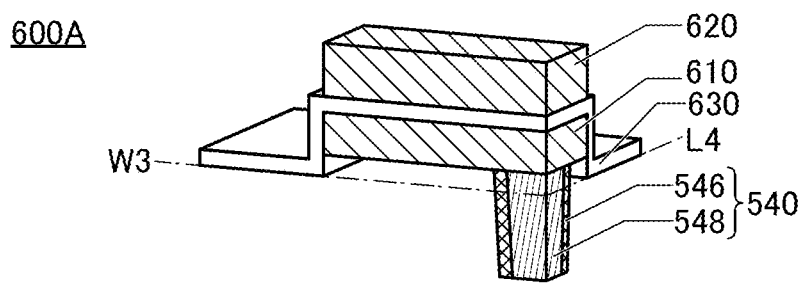

FIG. 13 illustrates a capacitor 600A as an example of the capacitor 600 that can be used in the semiconductor devices illustrated in FIG. 6 and FIG. 7. FIG. 13A is a top view of the capacitor 600A, FIG. 13B is a perspective view illustrating a cross section of the capacitor 600A along the dashed-dotted line L3-L4, and FIG. 13C is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric positioned between the pair of electrodes.

The insulator 630 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide.

As another example, the insulator 630 may have a stacked-layer structure using a material with high dielectric strength, such as silicon oxynitride, and a high permittivity (high-k) material. In the capacitor 600A having such a structure, a sufficient capacitance can be ensured owing to the high permittivity (high-k) insulator, and the dielectric strength can be increased owing to the insulator with high dielectric strength; hence, the electrostatic breakdown of the capacitor 600A can be inhibited.

Examples of the insulator of a high permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 630. In the case where the insulator 630 has stacked layers, a three-layer structure in which zirconium oxide, aluminum oxide, and zirconium oxide are formed in this order, or a four-layer structure in which zirconium oxide, aluminum oxide, zirconium oxide, and aluminum oxide are formed in this order can be employed, for example. For the insulator 630, a compound containing hafnium and zirconium may be used, for example. As miniaturization and high integration of semiconductor devices progress, a problem such as leakage current from a transistor and/or a capacitor might arise because of a thinner gate insulator and a thinner dielectric used in the capacitor. When a high-k material is used as an insulator functioning as the gate insulator and the dielectric used in the capacitor, a gate potential during operation of the transistor can be lowered and the capacitance of the capacitor can be ensured while the physical thicknesses of the gate insulator and the dielectric are maintained.

A bottom portion of the conductor 610 in the capacitor 600 is electrically connected to the conductor 546 and the conductor 548. The conductor 546 and the conductor 548 function as plugs or wirings for connection to another circuit element. In FIG. 13A to FIG. 13C, the conductor 546 and the conductor 548 are collectively denoted as a conductor 540.

For clarification of the drawing, the insulator 586 in which the conductor 546 and the conductor 548 are embedded and the insulator 650 that covers the conductor 620 and the insulator 630 are omitted in FIG. 13.

Although the capacitor 600 illustrated in FIG. 6, FIG. 7, FIG. 13A, FIG. 13B, and FIG. 13C is a planar capacitor, the shape of the capacitor is not limited thereto. For example, the capacitor 600 may be a cylindrical capacitor 600B illustrated in FIG. 14A to FIG. 14C.

Figure 14A:
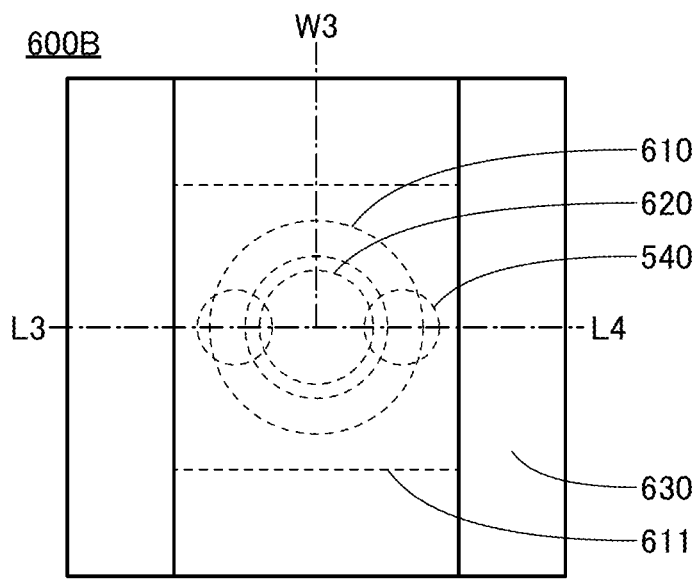
FIG. 14A is a top view illustrating a structure example of a capacitor.
Figure 14B:
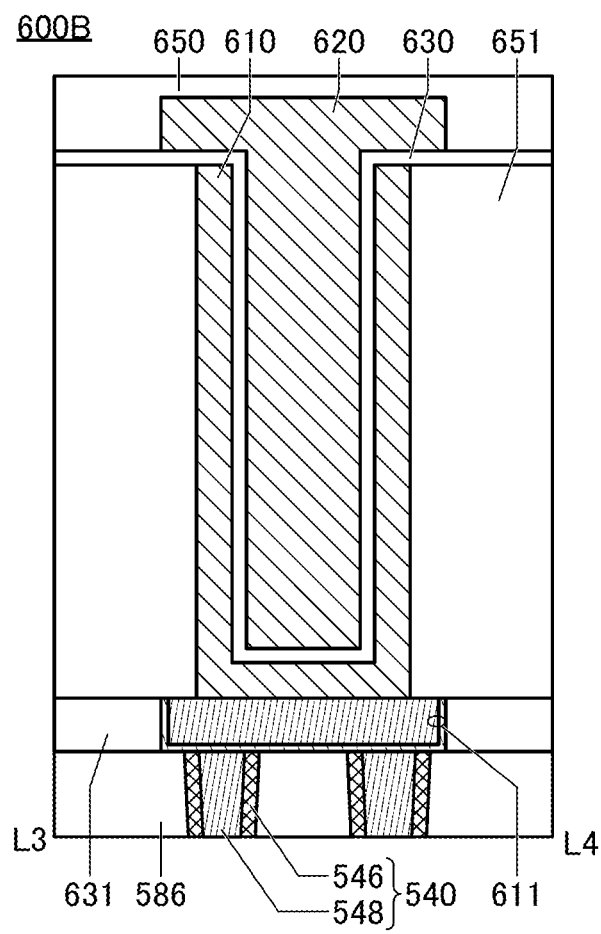
FIG. 14B is a cross-sectional view illustrating the structure example of the capacitor.
Figure 14C:
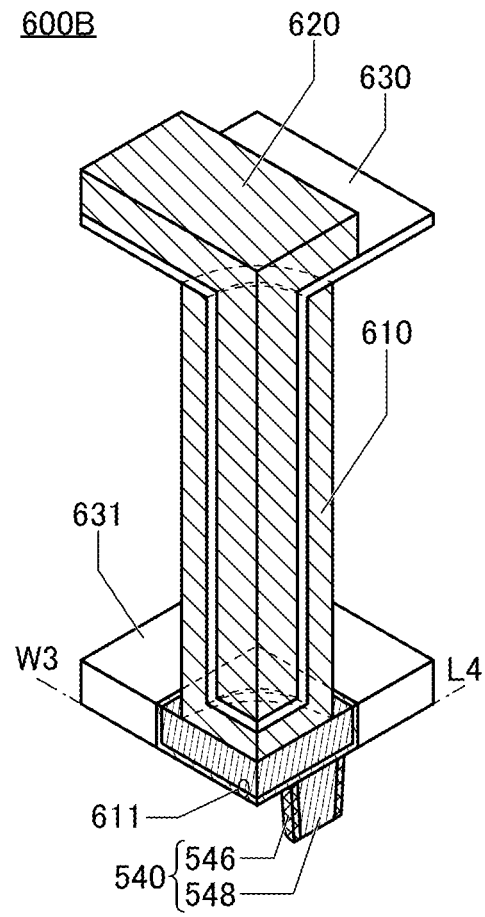
FIG. 14C is a cross-sectional perspective view illustrating the structure example of the capacitor.

FIG. 14A is a top view of the capacitor 600B, FIG. 14B is a cross-sectional view of the capacitor 600B along the dashed-dotted line L3-L4, and FIG. 14C is a perspective view illustrating a cross section of the capacitor 600B along the dashed-dotted line W3-L4.

In FIG. 14B, the capacitor 600B includes an insulator 631 over the insulator 586 in which the conductor 540 is embedded, an insulator 651 having an opening portion, the conductor 610 functioning as one of a pair of electrodes, and the conductor 620 functioning as the other of the pair of electrodes.

For clarification of the drawing, the insulator 586, an insulator 650, and the insulator 651 are omitted in FIG. 14C.

For the insulator 631, a material similar to that for the insulator 586 can be used, for example.

A conductor 611 is embedded in the insulator 631 to be electrically connected to the conductor 540. For the conductor 611, a material similar to those for the conductor 330 and the conductor 518 can be used, for example.

For the insulator 651, a material similar to that for the insulator 586 can be used, for example.

The insulator 651 has an opening portion as described above, and the opening portion overlaps with the conductor 611.

The conductor 610 is formed on the bottom portion and the side surface of the opening portion. In other words, the conductor 610 overlaps with the conductor 611 and is electrically connected to the conductor 611.

The conductor 610 is formed in such a manner that an opening portion is formed in the insulator 651 by an etching method or the like, and then the conductor 610 is formed by a sputtering method, an ALD method, or the like. After that, the conductor 610 formed over the insulator 651 can be removed by a CMP (Chemichal Mechanical Polishing) method or the like while the conductor 610 formed in the opening portion is left.

The insulator 630 is positioned over the insulator 651 and the formation surface of the conductor 610. Note that the insulator 630 functions as a dielectric positioned between the pair of electrodes in the capacitor.

The conductor 620 is formed over the insulator 630 so as to fill the opening portion of the insulator 651.

The insulator 650 is formed to cover the insulator 630 and the conductor 620.

The electrostatic capacitance of the cylindrical capacitor 600B illustrated in FIG. 14 can be higher than that of the planar capacitor 600A.

In the semiconductor device of one embodiment of the present invention, a photoelectric conversion element may be provided above the capacitor 600 in the semiconductor devices illustrated in FIG. 6 and FIG. 7. That is, one embodiment of the present invention may be an imaging device including the level shifter described in the above embodiment. An imaging device converts a current induced by a photoelectric conversion element, for example, into a digital signal by a current-to-voltage converter circuit, an analog-to-digital converter circuit, or the like; providing the level shifter in the imaging device enables level-shifting of the digital signal.

Figure 15:
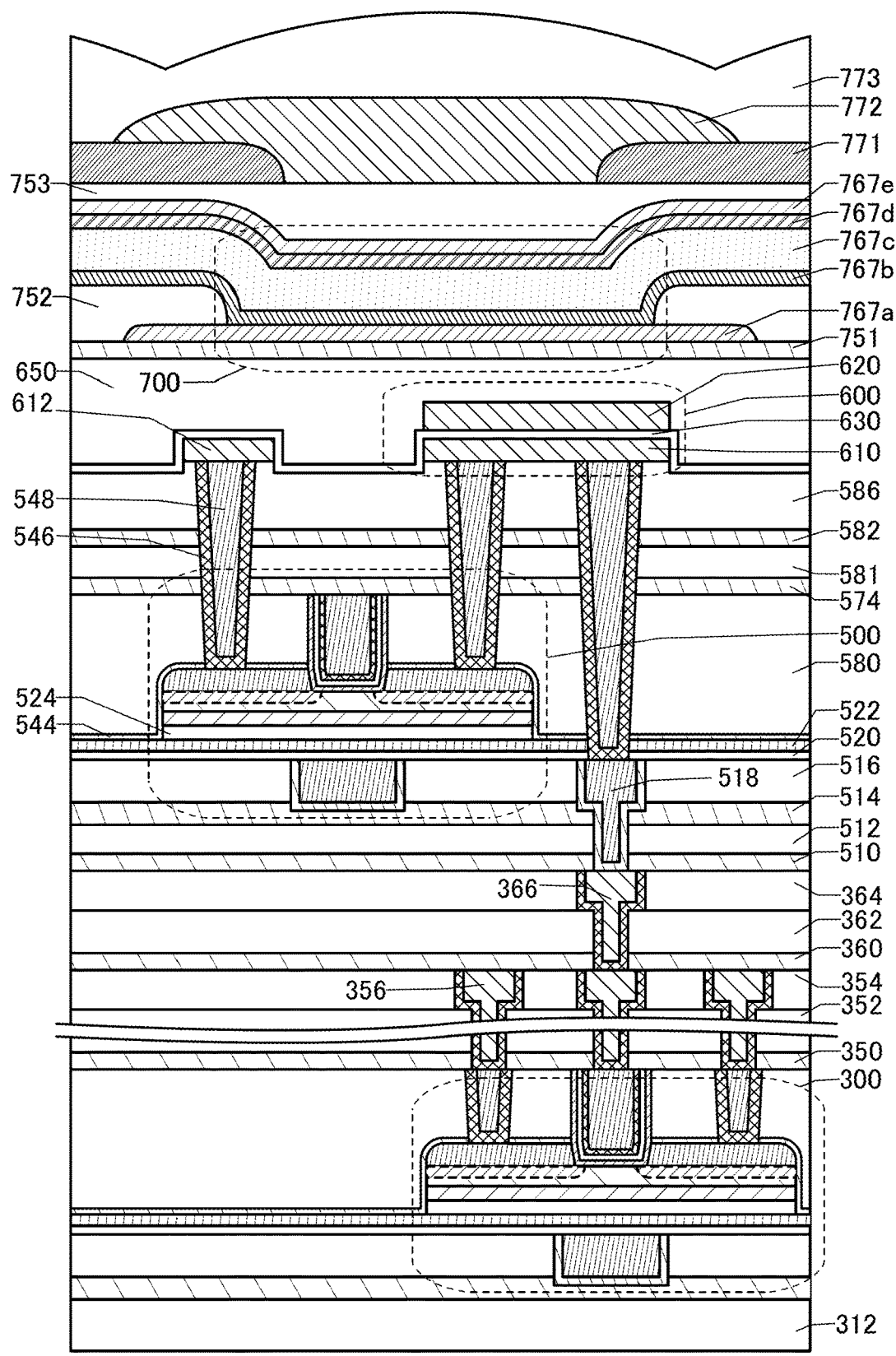
FIG. 15 is a schematic cross-sectional view illustrating a structure example of an imaging device.

FIG. 15 illustrates a structure example of an imaging device in which a photoelectric conversion element 700 is provided above the capacitor 600 in the semiconductor device illustrated in FIG. 7. Note that the photoelectric conversion element 700 may be provided below the transistor 300 instead of above the capacitor 600.

The photoelectric conversion element 700 includes a layer 767a, a layer 767b, a layer 767c, a layer 767d, and a layer 767e, for example.

The photoelectric conversion element 700 illustrated in FIG. 15 is an example of an organic optical conductive film. The layer 767a is a lower electrode, the layer 767e is an upper electrode having a light-transmitting property, and the layer 767b, the layer 767c, and the layer 767d correspond to a photoelectric conversion portion. Note that instead of the photoelectric conversion element 700 illustrated in FIG. 15, a PN junction photodiode, an avalanche photodiode, or the like may be used, for example.

The layer 767a serving as the lower electrode can be one of an anode and a cathode, and the layer 767b serving as the upper electrode can be the other of the anode and the cathode. Note that in this embodiment, the layer 767a is the cathode and the layer 767b is the anode.

The layer 767a is preferably a low-resistance metal layer or the like, for example. Specifically, for example, aluminum, titanium, tungsten, tantalum, silver, or a stack thereof can be used as the layer 767a.

As the layer 767e, for example, a conductive layer having a high visible-light-transmitting property is preferably used. Specifically, for example, indium oxide, tin oxide, zinc oxide, indium tin oxide, gallium zinc oxide, indium gallium zinc oxide, graphene, or the like can be used for the layer 767e. Note that the layer 767e can be omitted.

One of the layer 767b and the layer 767d in the photoelectric conversion portion can be a hole-transport layer and the other can be an electron-transport layer. The layer 767c can be a photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, a mixed layer of an n-type organic semiconductor and a p-type organic semiconductor (a bulk heterojunction structure) can be used.

In the imaging device in FIG. 15, an insulator 751 is provided over the insulator 650, and the layer 767a is provided over the insulator 751. An insulator 752 is provided over the insulator 751 and the layer 767a. The layer 767b is provided over the insulator 752 and the layer 767a.

The layer 767c, the layer 767d, the layer 767e, and an insulator 753 are provided in this order to be stacked over the layer 767b.

The insulator 751 functions as an interlayer insulating film, for example. Like the insulator 324, the insulator 751 is preferably formed using an insulator having a barrier property against hydrogen, for example. The use of an insulator having a barrier property against hydrogen as the insulator 751 can inhibit diffusion of hydrogen into the transistor 500. Thus, the insulator 751 can be formed using any of the materials that can be used for the insulator 324, for example.

The insulator 752 functions as an element isolation layer, for example. The insulator 752 is provided to prevent a short circuit with an adjacent photoelectric conversion element, which is not illustrated. An organic insulator or the like is preferably used as the insulator 752, for example.

The insulator 753 functions as a planarization film having a light-transmitting property, for example. The insulator 753 can be formed using a material such as silicon oxide, silicon oxynitride, silicon nitride oxide, or silicon nitride, for example.

A light-blocking layer 771, an optical conversion layer 772, and a microlens array 773 are provided above the insulator 753, for example.

The light-blocking layer 771 provided over the insulator 753 can suppress entry of light into an adjacent pixel. As the light-blocking layer 771, a metal layer of aluminum, tungsten, or the like can be used. Alternatively, the metal layer and a dielectric film having a function of an anti-reflection film may be stacked.

A color filter can be used as the optical conversion layer 772 provided over the insulator 753 and the light-blocking layer 771. When colors of R (red), G (green), B (blue), Y (yellow), C (cyan), M (magenta), and the like are assigned to the color filters of respective pixels, a color image can be obtained.

When a wavelength cut filter is used as the optical conversion layer 772, the imaging device can capture images in various wavelength regions.

For example, when a filter that blocks light having a wavelength shorter than or equal to that of visible light is used as the optical conversion layer 772, an infrared imaging device can be obtained. When a filter that blocks light having a wavelength shorter than or equal to that of near infrared light is used as the optical conversion layer 772, a far-infrared imaging device can be obtained. When a filter that blocks light having a wavelength longer than or equal to that of visible light is used as the optical conversion layer 772, an ultraviolet imaging device can be obtained.

Furthermore, when a scintillator is used for the optical conversion layer 772, it is possible to achieve an imaging device that obtains an image visualizing the intensity of radiation, which is used for an X-ray imaging device or the like. Radiation such as X-rays passes through an object and enters the scintillator, and then is converted into light (fluorescence) such as visible light or ultraviolet light owing to a photoluminescence phenomenon. Then, the photoelectric conversion element 700 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, it is possible to use a resin, ceramics, or the like in which $Gd_2O_2S:Tb$, $Gd_2O_2S:Pr$, $Gd_2O_2S:Eu$, $BaFC_1:Eu$, NaI, CsI, $CaF_2$, $BaF_2$, $CeF_3$, LiF, LiI, ZnO, or the like is dispersed.

The microlens array 773 is provided over the light-blocking layer 771 and the optical conversion layer 772. Light passing through an individual lens of the microlens array 773 goes through the optical conversion layer 772 directly under the lens, and the photoelectric conversion element 700 is irradiated with the light. With the microlens array 773, collected light can be incident on the photoelectric conversion element 700; thus, photoelectric conversion can be efficiently performed. The microlens array 773 is preferably formed using a resin, glass, or the like with a high visible-light-transmitting property.

Although FIG. 15 illustrates the structure of the imaging device in which the photoelectric conversion element 700 using an organic optical conductive film is provided above the transistor 300 and the transistor 500, the imaging device of one embodiment of the present invention is not limited thereto. For example, the imaging device of one embodiment of the present invention may be provided with a back-surface irradiation type PN junction photoelectric conversion element instead of the photoelectric conversion element 700.

Figure 16:
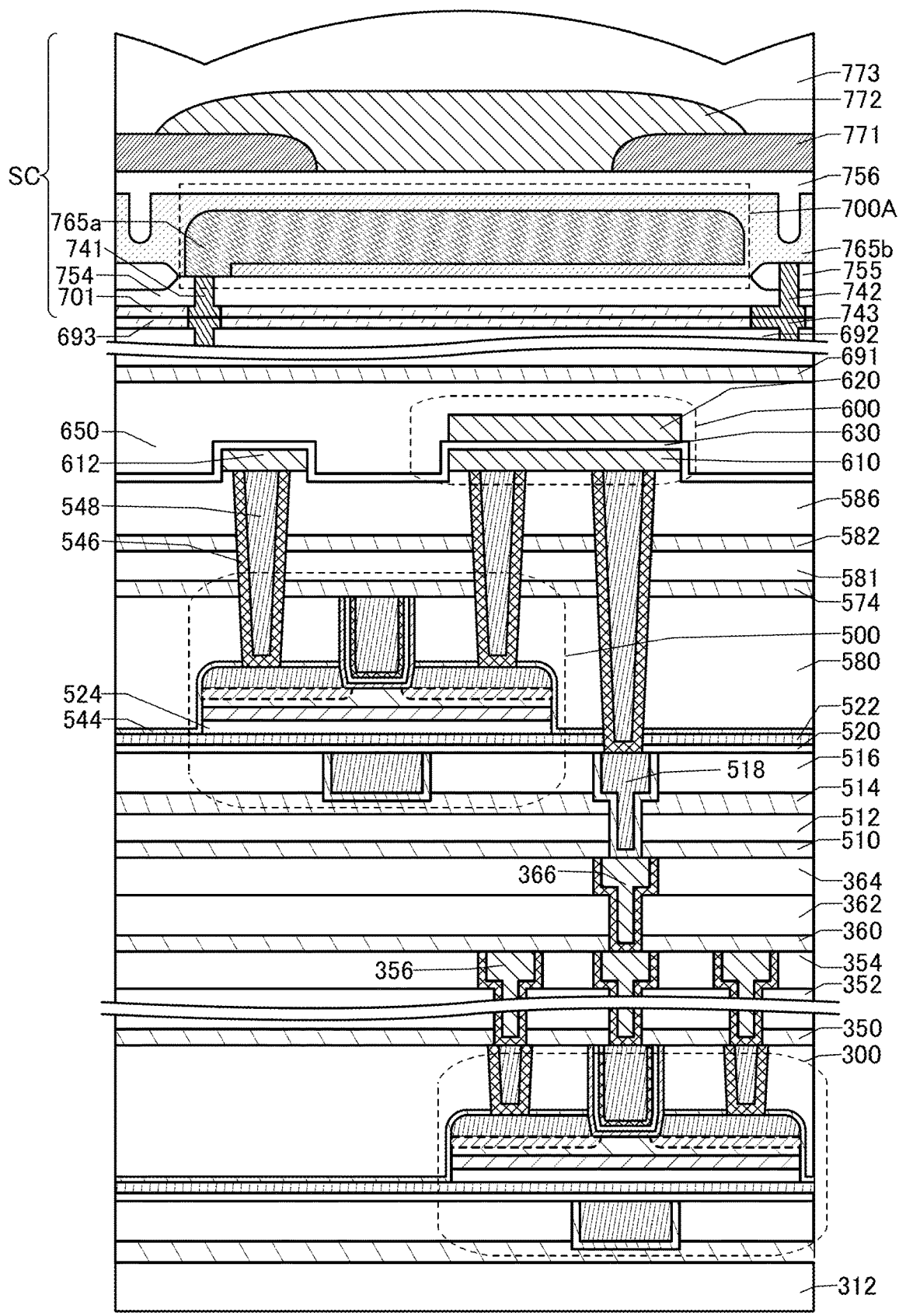
FIG. 16 is a schematic cross-sectional view illustrating a structure example of an imaging device.

FIG. 16 illustrates a structure example of an imaging device in which a back-surface irradiation type PN junction photoelectric conversion element 700A is provided above the transistor 300 and the transistor 500. In the imaging device illustrated in FIG. 16, a component SC including the photoelectric conversion element 700A is attached onto the substrate 312 where the transistor 300, the transistor 500, and the capacitor 600 are provided.

Note that the component SC includes the light-blocking layer 771, the optical conversion layer 772, and the microlens array 773; the above description can be referred to for these components.

The photoelectric conversion element 700A is a PN junction photodiode formed on a silicon substrate and includes a layer 765b corresponding to a p-type region and a layer 765a corresponding to an n-type region. The photoelectric conversion element 700A is a pinned photodiode and can suppress a dark current and reduce noise with a thin p-type region (part of the layer 765b) provided on the surface side (current extraction side) of the layer 765a.

An insulator 701, a conductor 741, and a conductor 742 each have a function of an attachment layer. An insulator 754 has functions of an interlayer insulating film and a planarization film. An insulator 755 has a function of an element isolation layer. An insulator 756 has a function of suppressing carrier leakage.

The silicon substrate is provided with a groove that separates pixels, and the insulator 756 is provided on the top surface of the silicon substrate and in the groove. The insulator 756 can suppress leakage of carriers generated in the photoelectric conversion element 700A to an adjacent pixel. The insulator 756 also has a function of suppressing entry of stray light. Therefore, color mixture can be suppressed with the insulator 756. Note that an anti-reflection film may be provided between the top surface of the silicon substrate and the insulator 756.

The element isolation layer can be formed by a LOCOS (LOCal Oxidation of Silicon) method. Alternatively, an STI (Shallow Trench Isolation) method or the like may be used to form the element isolation layer. As the insulator 756, for example, an inorganic insulating film of silicon oxide, silicon nitride, or the like or an organic insulating film of polyimide, acrylic, or the like can be used. The insulator 756 may have a multilayer structure.

The layer 765a (corresponding to the n-type region and the cathode) of the photoelectric conversion element 700A is electrically connected to the conductor 741. The layer 765b (corresponding to the p-type region and the anode) is electrically connected to the conductor 742. The conductor 741 and the conductor 742 each include a region embedded in the insulator 701. Furthermore, surfaces of the insulator 701, the conductor 741, and the conductor 742 are planarized to be level with each other.

An insulator 691 and an insulator 692 are stacked in this order above the insulator 650. For example, in FIG. 16, an opening portion is provided in the insulator 692, and a conductor 743 is formed to fill the opening portion.

For the insulator 691, the material usable for the insulator 751 can be used, for example.

For the insulator 692, the material usable for the insulator 650 can be used, for example.

The insulator 693 and the insulator 701 each function as part of an attachment layer. In addition, the conductor 741, the conductor 742, and the conductor 743 each function as part of an attachment layer.

For example, silicon oxide, silicon oxynitride, silicon nitride oxide, silicon nitride, titanium nitride, or the like can be used for the insulator 693 and the insulator 701. Since the insulator 693 and the insulator 701 are bonded to each other, it is particularly preferable that the insulator 693 and the insulator 701 be formed using the same components.

For example, copper, aluminum, tin, zinc, tungsten, silver, platinum, gold, or the like can be used for the conductor 741, the conductor 742, and the conductor 743. It is particularly preferable to use copper, aluminum, tungsten, or gold for easy bonding of the conductor 741 and the conductor 743, and the conductor 742 and the conductor 743.

The conductor 741, the conductor 742, and the conductor 743 may each have a multilayer structure including a plurality of layers. For example, a first conductor may be formed on the side surface of the opening portion in which the conductor 741, the conductor 742, or the conductor 743 is provided, and then a second conductor may be formed to fill the opening portion. A conductor having a barrier property against hydrogen, such as tantalum nitride, can be used as the first conductor, and tungsten with high conductivity can be used as the second conductor, for example.

In a step prior to bonding the attachment layer on the substrate 312 side and the attachment layer on the component SC side, the surfaces of the insulator 693 and the conductor 743 are planarized so that they are level with each other on the substrate 312 side. Similarly, the surfaces of the insulator 701, the conductor 741, and the conductor 742 are planarized so that they are level with each other on the component SC side.

In the case where bonding of the insulator 693 and the insulator 701, i.e., bonding of the insulating layers, is performed in the bonding step, a hydrophilic bonding method or the like can be employed in which, after high planarity is obtained by polishing or the like, the surfaces subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When bonding of the conductor 741 and the conductor 743 and bonding of the conductor 742 and the conductor 743, i.e., bonding of the conductors, are performed, for example, a surface activated bonding method can be used in which an oxide film, a layer adsorbing impurities, and the like on the surface are removed by sputtering processing or the like and the cleaned and activated surfaces are brought into contact to be bonded to each other. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Through the above-described bonding step, the conductor 743 on the substrate 312 side can be electrically connected to the conductor 741 and the conductor 742 on the component SC side. In addition, mechanically strong connection can be established between the insulator 693 on the substrate 312 side and the insulator 701 on the component SC side.

When the substrate 312 and the component SC are bonded to each other, the insulating layers and the metal layers coexist on their bonding surfaces; therefore, the surface activated bonding method and the hydrophilic bonding method are performed in combination, for example.

For example, it is possible to use a method in which the surfaces are made clean after polishing, the surfaces of the metal layers are subjected to antioxidant treatment followed by hydrophilicity treatment, and then bonding is performed. Furthermore, hydrophilicity treatment may be performed on the surfaces of the metal layers being a hardly oxidizable metal such as gold. Note that a bonding method other than the above-mentioned methods may be used.

Note that this embodiment can be combined with any of the other embodiments in this specification as appropriate.

Embodiment 3

Described in this embodiment is a metal oxide (hereinafter also referred to as an oxide semiconductor) that can be used in an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor will be described with reference to FIG. 17A. FIG. 17A is a diagram showing the classification of crystal structures of an oxide semiconductor, typically IGZO (a metal oxide containing In, Ga, and Zn).

As shown in FIG. 17A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 17A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 17B shows an XRD spectrum, which is obtained by GIXD (Grazing-Incidence XRD) measurement, of a CAAC-IGZO film classified into "Crystalline" (the horizontal axis represents 2θ [deg.] and the vertical axis represents intensity in arbitrary unit (a.u.)). Note that a GIXD method is also referred to as a thin film method or a Seemann-Bohlin method. The XRD spectrum that is shown in FIG. 17B and obtained by GIXD measurement is hereinafter simply referred to as an XRD spectrum. The composition of the CAAC-IGZO film shown in FIG. 17B is In:Ga:Zn=4:2:3

[atomic ratio] or the neighborhood thereof. The CAAC-IGZO film shown in FIG. 17B has a thickness of 500 nm.

As shown in FIG. 17B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 17B, the peak at 2θ of around 31° is asymmetric with respect to the axis of the angle at which the peak intensity (Intensity) is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 17C shows a diffraction pattern of a CAAC-IGZO film. FIG. 17C shows a diffraction pattern obtained with the NBED method in which an electron beam is incident in the direction parallel to the substrate. The composition of the CAAC-IGZO film shown in FIG. 17C is In:Ga:Zn=4:2:3 [atomic ratio] or the neighborhood thereof. In the nanobeam electron diffraction method, electron diffraction is performed with a probe diameter of 1 nm.

As shown in FIG. 17C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 17A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region with a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, and/or the like might decrease the crystallinity of an oxide semiconductor, which means that the CAAC-OS can be referred to as an oxide semiconductor having small amounts of impurities and/or defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget).

Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon, carbon, or the like, which is a Group 14 element, is contained in an oxide semiconductor, defect states are formed in the oxide semiconductor. Thus, the concentration of silicon, carbon, or the like in the oxide semiconductor and in the vicinity of an interface with the oxide semiconductor (the concentration obtained by secondary ion mass spectrometry (SIMS)) is lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Hence, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 4

In this embodiment, examples of a semiconductor wafer where the semiconductor device or the like described in the above embodiment is formed and electronic components incorporating the semiconductor device will be described.

<Semiconductor Wafer>

First, an example of a semiconductor wafer where a semiconductor device or the like is formed is described with reference to FIG. 18A.

Figure 18A:
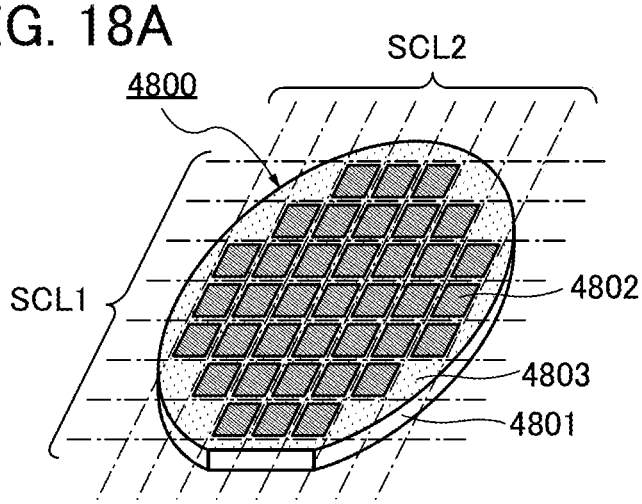
FIG. 18A is a perspective view illustrating an example of a semiconductor wafer.

A semiconductor wafer 4800 illustrated in FIG. 18A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on a surface of the wafer 4801 by a wafer process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated with dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 18B:
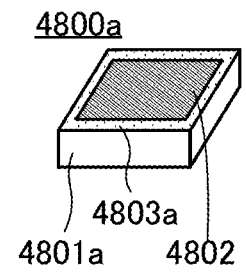
FIG. 18B is a perspective view illustrating an example of a chip.

With the dicing step, a chip 4800a as illustrated in FIG. 18B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a cutting allowance of the scribe line SCL1 or a cutting allowance of the scribe line SCL2.

Note that the shape of an element substrate of one embodiment of the present invention is not limited to the shape of the semiconductor wafer 4800 illustrated in FIG. 18A. The element substrate may be a rectangular semiconductor wafer, for example. The shape of the element substrate can be changed as appropriate, depending on a manufacturing process of an element and an apparatus for manufacturing the element.

<Electronic Component>

Figure 18C:
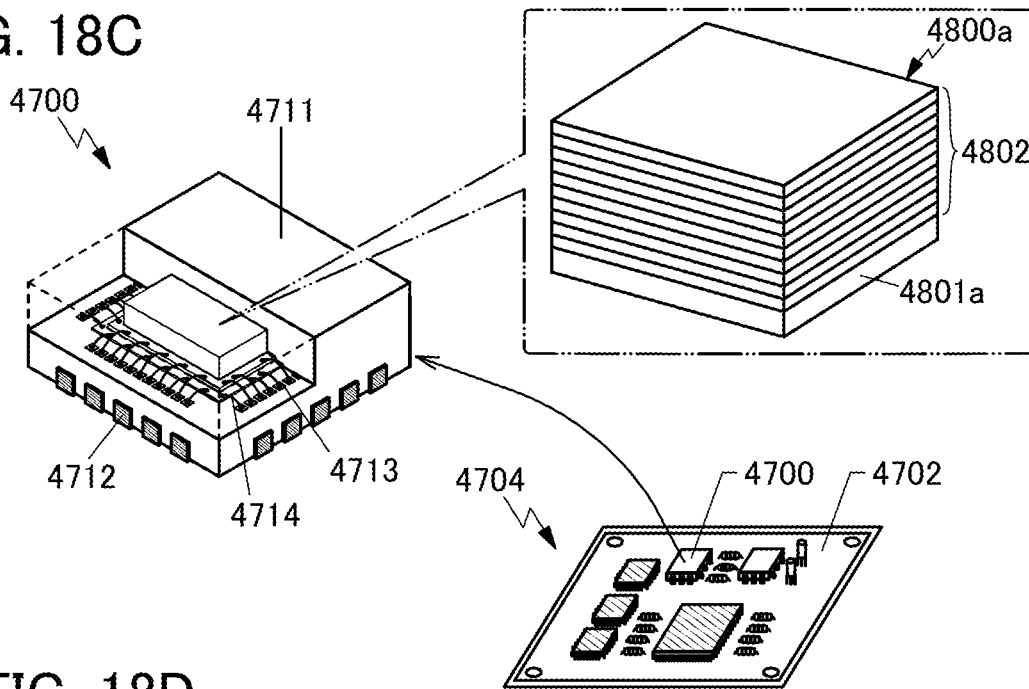
FIG. 18C and FIG. 18D are perspective views illustrating examples of electronic components.

FIG. 18C is a perspective view of an electronic component 4700 and a substrate (a mounting board 4704) on which the electronic component 4700 is mounted. The electronic component 4700 illustrated in FIG. 18C includes the chip 4800a in a mold 4711. Note that the chip 4800a may have a structure in which the circuit portions 4802 are stacked as illustrated in FIG. 18C. To illustrate the inside of the electronic component 4700, some portions are omitted in FIG. 18C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 18D:
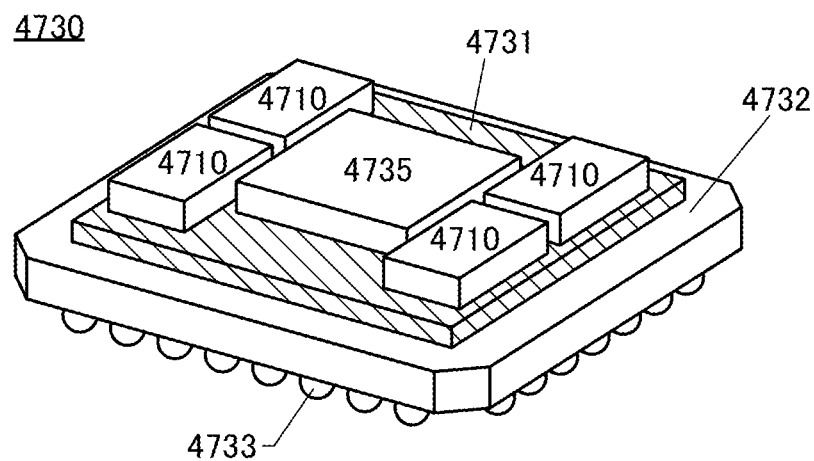

FIG. 18D is a perspective view of an electronic component 4730. The electronic component 4730 is an example of a SiP (System in Package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor device 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a layered structure. Moreover, the interposer 4731 has a function of electrically connecting an integrated circuit provided on the interposer 4731 to an electrode provided on the package substrate 4732. Accordingly, the interposer is sometimes referred to as a redistribution substrate or an intermediate substrate. A through electrode is provided in the interposer 4731 and used to electrically connect an integrated circuit and the package substrate 4732 in some cases. In the case of using a silicon interposer, a TSV (Through Silicon Via) can also be used as the through electrode.

A silicon interposer is preferably used as the interposer 4731. The silicon interposer can be manufactured at lower cost than an integrated circuit because it is not necessary to provide an active element. Meanwhile, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, a surface of a silicon interposer has high planarity; hence, a poor connection between the silicon interposer and an integrated circuit provided thereon is less likely to occur. It is particularly preferable to use a silicon interposer for a 2.5D package (2.5D mounting) in which a plurality of integrated circuits are arranged side by side on the interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 18D shows an example in which the electrode 4733 is formed of a solder ball. The solder balls are provided in a matrix on the bottom portion of the package substrate 4732, whereby BGA (Ball Grid Array) mounting can be achieved. Alternatively, the electrode 4733 may be formed of a conductive pin. When the conductive pins are provided in a matrix on the bottom portion of the package substrate 4732, PGA (Pin Grid Array) mounting can be achieved.

The electronic component 4730 can be mounted on another substrate by any of various mounting methods other than BGA and PGA. For example, a mounting method such as an SPGA (Staggered Pin Grid Array), an LGA (Land Grid Array), a QFP (Quad Flat Package), a QFJ (Quad Flat J-leaded package), or a QFN (Quad Flat Non-leaded package) can be employed.

Next, an electronic component including an image sensor chip (an imaging device) that includes a photoelectric conversion element will be described.

Figure 19A:
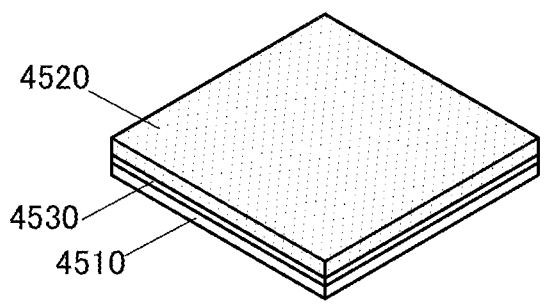
FIG. 19A to FIG. 19F are perspective views illustrating a package and a module each including an imaging device.

FIG. 19A is an external perspective view of the top surface side of a package in which an image sensor chip is placed. The package includes a package substrate 4510 to which an image sensor chip 4550 (see FIG. 19C) is fixed, a cover glass 4520, an adhesive 4530 for bonding them, and the like.

Figure 19D:
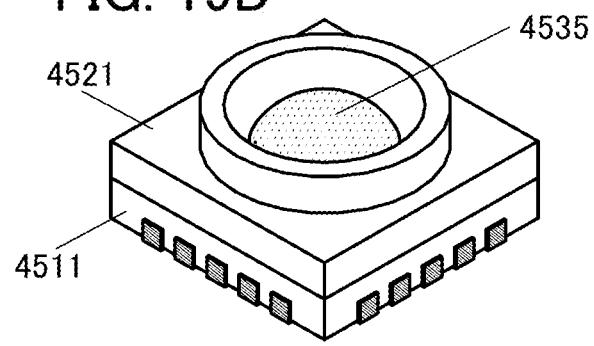
Figure 19B:
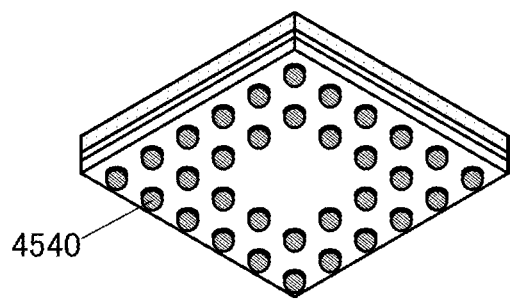

FIG. 19B is an external perspective view of the bottom surface side of the package. A BGA (Ball Grid Array) in which solder balls are used as bumps 4540 on the bottom surface of the package is employed. Note that other than the BGA, an LGA (Land Grid Array), a PGA (Pin Grid Array), or the like may be employed.

Figure 19E:
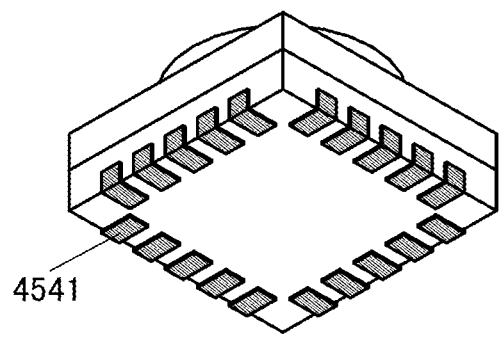
Figure 19C:
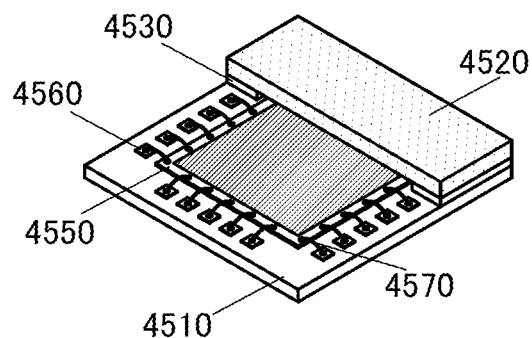

FIG. 19C is a perspective view of the package, in which parts of the cover glass 4520 and the adhesive 4530 are not illustrated. Electrode pads 4560 are formed over the package substrate 4510, and the electrode pads 4560 and the bumps 4540 are electrically connected to each other via through-holes. The electrode pads 4560 are electrically connected to the image sensor chip 4550 through wires 4570.

FIG. 19D is an external perspective view of the top surface side of a camera module in which an image sensor chip is placed in a package with a built-in lens. The camera module includes a package substrate 4511 to which an image sensor chip 4551 (FIG. 19F) is fixed, a lens cover 4521, a lens 4535, and the like. An IC chip 4590 (FIG. 19F) having functions of a driver circuit, a signal conversion circuit, and the like of an imaging device is provided between the package substrate 4511 and the image sensor chip 4551; thus, the structure as an SiP (System in Package) is included.

FIG. 19E is an external perspective view of the bottom surface side of the camera module. A QFN (Quad Flat No-lead package) structure in which lands 4541 for mounting are provided on the bottom surface and side surfaces of the package substrate 4511 is employed. Note that this structure is an example, and a QFP (Quad Flat Package), the above-mentioned BGA, or the like may also be employed.

Figure 19F:
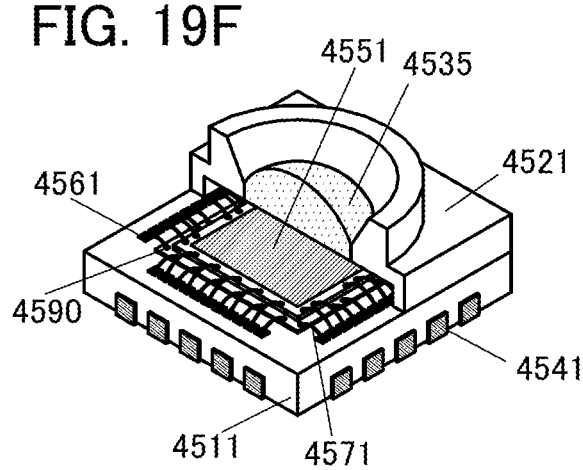

FIG. 19F is a perspective view of the module, in which parts of the lens cover 4521 and the lens 4535 are not illustrated. The lands 4541 are electrically connected to electrode pads 4561, and the electrode pads 4561 are electrically connected to the image sensor chip 4551 or the IC chip 4590 through wires 4571.

The image sensor chip placed in a package having the above form can be easily mounted on a printed circuit board and the like; hence, the image sensor chip can be incorporated into a variety of semiconductor devices and electronic devices.

Note that this embodiment can be combined with any of the other embodiments in this specification as appropriate.

Embodiment 5

Figure 20:
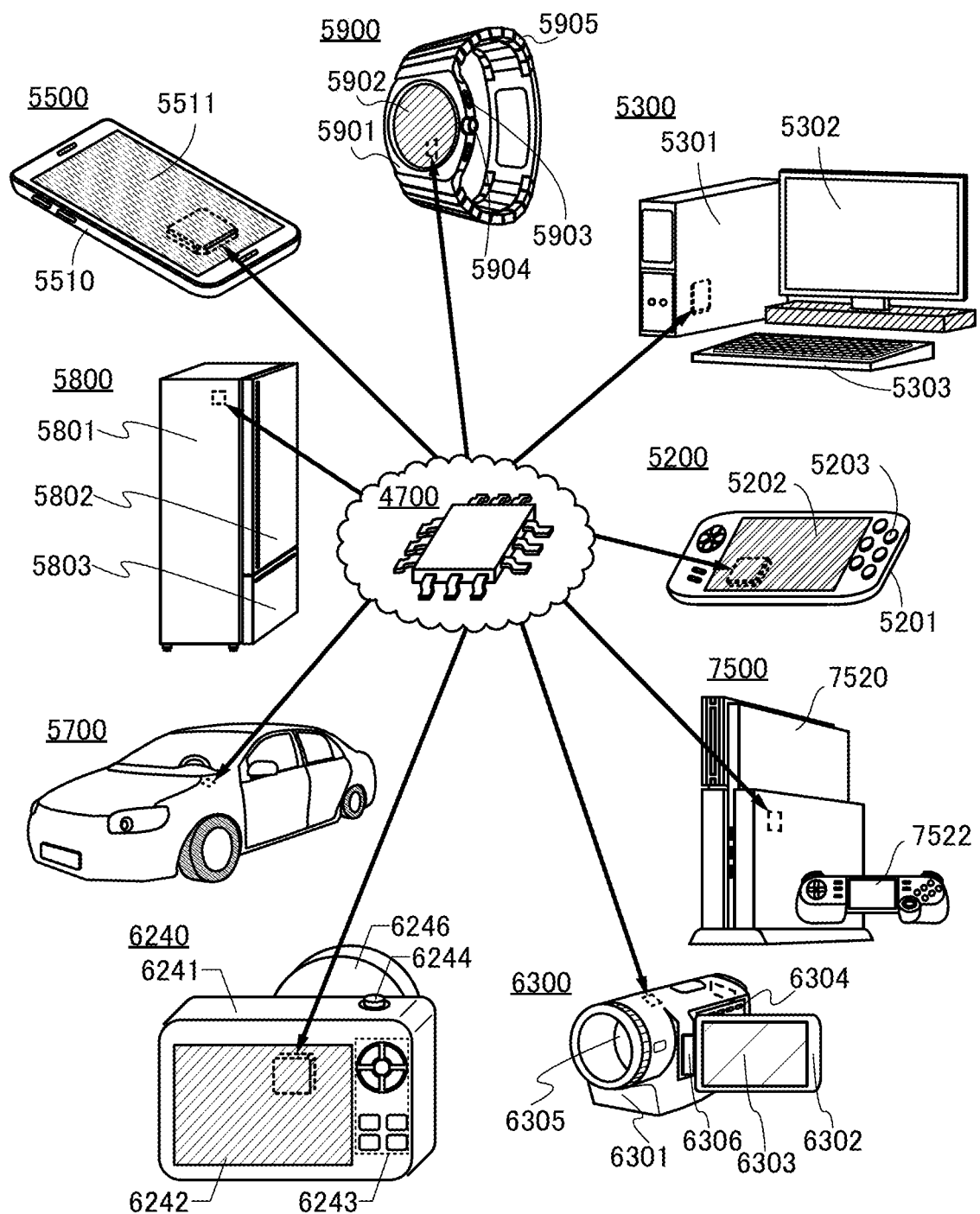
FIG. 20 is a perspective view illustrating examples of electronic devices.

In this embodiment, examples of electronic devices each including the semiconductor device described in the above embodiment will be described. FIG. 20 illustrates electronic devices each including the electronic component 4700 including the semiconductor device.

[Mobile Phone]

An information terminal 5500 illustrated in FIG. 20 is a mobile phone (a smartphone), which is a type of portable information terminal. The information terminal 5500 includes a housing 5510 and a display portion 5511, and as input interfaces, a touch panel is provided in the display portion 5511 and a button is provided in the housing 5510.

Although not illustrated in FIG. 20, the information terminal 5500 includes semiconductor devices such as a memory device and an imaging device. Here, when the information terminal 5500 employs the semiconductor device described in the above embodiment, power consumption of the memory device, the imaging device, the display portion 5511, and the like can be reduced. Furthermore, heat generation from a circuit can be reduced owing to low power consumption; thus, the influence of heat generation on the circuit itself, the peripheral circuit, and the module can be reduced.

[Wearable Terminal]

FIG. 20 illustrates a watch-type information terminal 5900 as an example of a wearable terminal. The information terminal 5900 includes a housing 5901, a display portion 5902, an operation button 5903, an operator 5904, a band 5905, and the like.

When the wearable terminal, like the aforementioned information terminal 5500, employs the semiconductor device described in the above embodiment, it is possible to reduce power consumption of semiconductor devices such as a memory device, an imaging device, and the display portion 5902 included in the wearable terminal.

[Information Terminal]

FIG. 20 illustrates a desktop information terminal 5300. The desktop information terminal 5300 includes a main body 5301 of the information terminal, a display 5302, and a keyboard 5303.

When the desktop information terminal 5300, like the aforementioned information terminal 5500, employs the semiconductor device described in the above embodiment, it is possible to reduce power consumption of semiconductor devices included in the desktop information terminal 5300

Note that although FIG. 20 illustrates the smartphone, the desktop information terminal, and the wearable terminal as examples of electronic devices, one embodiment of the present invention can also be applied to information terminals other than smartphones, desktop information terminals, and wearable terminals. Examples of information terminals other than smartphones, desktop information terminals, and wearable terminals include a PDA (Personal Digital Assistant), a laptop information terminal, and a workstation.

[Household Appliance]

FIG. 20 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiment is used in the electric refrigerator-freezer 5800, power consumption of the electric refrigerator-freezer 5800 can be reduced.

Here, an electric refrigerator-freezer is described as an example of a household appliance; other examples of household appliances include a vacuum cleaner, a microwave oven, an electric oven, a rice cooker, a water heater, an IH (Induction Heating) cooker, a water server, a heating-cooling combination appliance such as an air conditioner, a washing machine, a drying machine, and an audio visual appliance.

[Game Machines]

FIG. 20 illustrates a portable game machine 5200 as an example of a game machine. The portable game machine 5200 includes a housing 5201, a display portion 5202, a button 5203, and the like.

FIG. 20 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 20, the controller 7522 can include a display portion that displays a game image, and an input interface besides a button, such as a touch panel, a stick, a rotating knob, or a sliding knob, for example. The shape of the controller 7522 is not limited to that shown in FIG. 20, and the shape of the controller 7522 may be changed variously in accordance with the genres of games. For example, in a shooting game such as an FPS (First Person Shooter) game, a gun-shaped controller having a trigger button can be used. As another example, in a music game or the like, a controller having a shape of a music instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, and a head-mounted display.

When the semiconductor device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Although FIG. 20 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used in an automobile, which is a moving vehicle, and around the driver's seat in an automobile.

FIG. 20 illustrates an automobile 5700 as an example of a moving vehicle.

An instrument panel that can display a speedometer, a tachometer, a mileage, a fuel meter, a gearshift state, air-conditioning setting, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety. That is, displaying an image taken by the imaging device provided on the exterior of the automobile 5700 can compensate for blind areas and enhance safety.

The semiconductor device described in the above embodiment can be used in the above-described instrument panel and imaging device, for example. Thus, power consumption of the instrument panel, the imaging device, and the like provided for the automobile 5700 can be reduced. Furthermore, heat generation from a circuit can be reduced owing to low power consumption; thus, the influence of heat generation on the circuit itself, the peripheral circuit, and the module can be reduced.

Note that although an automobile is described above as an example of the moving vehicle, the moving vehicle is not limited to an automobile. Other examples of the moving vehicle include a train, a monorail train, a ship, and a flying object (a helicopter, an unmanned aircraft (a drone), an airplane, and a rocket); power consumption of these moving vehicles can be reduced by employing the semiconductor device according to one embodiment of the present invention.

[Camera]

The semiconductor device described in the above embodiment can be used in a camera.

FIG. 20 illustrates a digital camera 6240 as an example of an imaging device. The digital camera 6240 includes a housing 6241, a display portion 6242, operation buttons 6243, a shutter button 6244, and the like, and a detachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 can be additionally equipped with a stroboscope, a viewfinder, or the like.

When the semiconductor device described in the above embodiment is used in an imaging device included in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

[Video Camera]

The semiconductor device described in the above embodiment can be used in a video camera.

FIG. 20 illustrates a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

Like the digital camera 6240, the video camera 6300 includes an imaging device. Thus, when the semiconductor device described in the above embodiment is used in the imaging device included in the video camera 6300, the video camera 6300 with low power consumption can be achieved. Furthermore, heat generation from a circuit can be reduced owing to low power consumption; thus, the influence of heat generation on the circuit itself, the peripheral circuit, and the module can be reduced.

Note that this embodiment can be combined with any of the other embodiments in this specification as appropriate.

REFERENCE NUMERALS

AM: memory portion, Tr1: transistor, Tr2: transistor, Tr3: transistor, Tr4: transistor, Tc1: transistor, TcL: transistor, C1: capacitor, CL: capacitor, FN: node, INE: wiring, BOTE: wiring, VDHE: wiring, VLSE: wiring, PRCE: wiring, EVE: wiring, CLPE: wiring, VAL: wiring, SA: layer, SB: layer, SC: component, 100: level shifter, 100A: level shifter, 100B: level shifter, 100C: level shifter, 200: transistor, 211: substrate, 212: substrate, 220: insulator, 222: insulator, 224: insulator, 226: insulator, 228: conductor, 229: conductor, 230: insulator, 231: insulator, 232: insulator, 233: conductor, 300: transistor, 311: substrate, 312: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 341: insulator, 342: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 402: insulator, 404: insulator, 500: transistor, 503: conductor, 503*a*: conductor, 503*b*: conductor, 510: insulator, 512: insulator, 514: insulator, 516: insulator, 518: conductor, 520: insulator, 522: insulator, 524: insulator, 530: oxide, 530*a*: oxide, 530*b*: oxide, 530*c*: oxide, 530*c*1: oxide, 530*c*2: oxide, 540: conductor, 540*a*: conductor, 540*b*: conductor, 542: conductor, 542*a*: conductor, 542*b*: conductor, 543*a*: region, 543*b*: region, 544: insulator, 546: conductor, 548: conductor, 550: insulator, 552: insulator, 560: conductor, 560*a*: conductor, 560*b*: conductor, 574: insulator, 580: insulator, 581: insulator, 582: insulator, 586: insulator, 600: capacitor, 600A: capacitor, 600B: capacitor, 610: conductor, 611: conductor, 612: conductor, 620: conductor, 630: insulator, 631: insulator, 650: insulator, 651: insulator, 691: insulator, 692: insulator, 693: insulator, 701: insulator, 741: conductor, 742: conductor, 743: conductor, 751: insulator, 752: insulator, 753: insulator, 754: insulator, 755: insulator, 756: insulator, 765*a*: layer, 765*b*: layer, 767*a*: layer, 767*b*: layer, 767*c*: layer, 767*d*: layer, 767*e*: layer, 771: light-blocking layer, 772: optical conversion layer, 4510: package substrate, 4511: package substrate, 4520: cover glass, 4521: lens cover, 4530: adhesive, 4535: lens, 4540: bump, 4541: land, 4550: image sensor chip, 4551: image sensor chip, 4560: electrode pad, 4561: electrode pad, 4570: wire, 4571: wire, 4590: IC chip, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800*a*: chip, 4801: wafer, 4801*a*: wafer, 4802: circuit portion, 4803: spacing, 4803*a*:

spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6240: digital camera, 6241: housing, 6242: display portion, 6243: operation button, 6244: shutter button, 6246: lens, 6300: video camera, 6301: housing, 6302: housing, 6303: display portion, 6304: operation key, 6305: lens, 6306: joint, 7500: stationary game machine, 7520: main body, 7522: controller

The invention claimed is:

1. A semiconductor device comprising:
a first transistor, a second transistor, a third transistor, a fourth transistor, a first capacitor, an input terminal and an output terminal,
wherein each of the first transistor, the second transistor, the third transistor and the fourth transistor has a first polarity,
wherein a first terminal of the first transistor is electrically connected to a first terminal of the second transistor and the output terminal,
wherein a second terminal of the second transistor is electrically connected to a first terminal of the third transistor,
wherein a first terminal of the fourth transistor is electrically connected to a gate of the second transistor and a first terminal of the first capacitor,
wherein a second terminal of the first capacitor is electrically connected to the input terminal,
wherein the input terminal is configured to be input to a first potential,
wherein a second terminal of the first transistor is input to a second potential,
wherein each of a second terminal of the third transistor and a second terminal of the fourth transistor is configured to be input to a third potential,
wherein the first transistor is configured to precharge the output terminal with the second potential when the first transistor is on,
wherein the second transistor is configured to turn on or off in response to the first potential input to the input terminal when the fourth transistor is off, and
wherein the semiconductor device is configured to set a potential of the output terminal to the second potential or the third potential when the output terminal has the second potential, the first transistor is off, and the third transistor is on.

2. The semiconductor device according to claim 1, further comprising a second capacitor,
wherein a first terminal of the second capacitor is electrically connected to the first terminal of the first transistor, the first terminal of the second transistor, and the output terminal.

3. The semiconductor device according to claim 1, wherein each of the first transistor to the fourth transistor comprises one of a metal oxide and silicon in a channel formation region.

4. The semiconductor device according to claim 1,
wherein the first capacitor comprises a fifth transistor,
wherein the fifth transistor comprises one of a metal oxide and silicon in a channel formation region,
wherein a gate of the fifth transistor serves as one of the first terminal and the second terminal of the first capacitor, and
wherein a first terminal and a second terminal of the fifth transistor serve as the other of the first terminal and the second terminal of the first capacitor.

5. An imaging device comprising:
the semiconductor device according to claim 1; and
a photoelectric conversion element,
wherein the photoelectric conversion element is positioned above the first transistor to the fourth transistor.

6. A semiconductor device comprising:
a first transistor, a second transistor, a third transistor, a fourth transistor, a first capacitor, an input terminal and an output terminal,
wherein each of the first transistor, the second transistor, the third transistor and the fourth transistor has a first polarity,
wherein a first terminal of the first transistor is electrically connected to a first terminal of the third transistor and the output terminal,
wherein a second terminal of the third transistor is electrically connected to a first terminal of the second transistor,
wherein a first terminal of the fourth transistor is electrically connected to a gate of the second transistor and a first terminal of the first capacitor,
wherein a second terminal of the first capacitor is electrically connected to the input terminal,
wherein the input terminal is configured to be input to a first potential,
wherein a second terminal of the first transistor is configured to be input to a second potential,
wherein each of a second terminal of the second transistor and a second terminal of the fourth transistor is configured to be input to a third potential,
wherein the first transistor is configured to precharge the output terminal with the second potential when the first transistor is on,
wherein the second transistor is configured to turn on or off in response to the first potential input to the input terminal when the fourth transistor is off, and
wherein the semiconductor device is configured to set a potential of the output terminal to the second potential or the third potential when the output terminal has the second potential, the first transistor is off, and the third transistor is on.

7. The semiconductor device according to claim 6, further comprising a second capacitor,
wherein a first terminal of the second capacitor is electrically connected to the first terminal of the first transistor, the first terminal of the second transistor, and the output terminal.

8. The semiconductor device according to claim 6, wherein each of the first transistor to the fourth transistor comprises one of a metal oxide and silicon in a channel formation region.

9. The semiconductor device according to claim 6,
wherein the first capacitor comprises a fifth transistor,
wherein the fifth transistor comprises one of a metal oxide and silicon in a channel formation region,
wherein a gate of the fifth transistor serves as one of the first terminal and the second terminal of the first capacitor, and
wherein a first terminal and a second terminal of the fifth transistor serve as the other of the first terminal and the second terminal of the first capacitor.

10. An imaging device comprising:
the semiconductor device according to claim 6; and
a photoelectric conversion element,
wherein the photoelectric conversion element is positioned above the first transistor to the fourth transistor.

11. A semiconductor device comprising:
a first transistor, a second transistor, a third transistor, a fourth transistor, a first capacitor, a second capacitor, an input terminal and an output terminal,
wherein each of the first transistor, the second transistor, the third transistor and the fourth transistor has a first polarity,
wherein a first terminal of the first transistor is electrically connected to a first terminal of the second transistor and the output terminal,
wherein a second terminal of the second transistor is electrically connected to a first terminal of the third transistor,
wherein a first terminal of the fourth transistor is electrically connected to a gate of the second transistor and a first terminal of the first capacitor,
wherein a second terminal of the first capacitor is electrically connected to the input terminal, and
wherein a first terminal of the second capacitor is electrically connected to the first terminal of the first transistor, the first terminal of the second transistor, and the output terminal.

12. The semiconductor device according to claim 11, wherein each of the first transistor to the fourth transistor comprises one of a metal oxide and silicon in a channel formation region.

13. The semiconductor device according to claim 11, wherein the first capacitor comprises a fifth transistor,
wherein the fifth transistor comprises one of a metal oxide and silicon in a channel formation region,
wherein a gate of the fifth transistor serves as one of the first terminal and the second terminal of the first capacitor, and
wherein a first terminal and a second terminal of the fifth transistor serve as the other of the first terminal and the second terminal of the first capacitor.

14. An imaging device comprising:
the semiconductor device according to claim 11; and
a photoelectric conversion element,
wherein the photoelectric conversion element is positioned above the first transistor to the fourth transistor.

* * * * *